(12) United States Patent
Zhang et al.

(10) Patent No.: US 11,764,069 B2
(45) Date of Patent: Sep. 19, 2023

(54) ASYMMETRY CORRECTION VIA VARIABLE RELATIVE VELOCITY OF A WAFER

(71) Applicant: Applied Materials, Inc., Santa Clara, CA (US)

(72) Inventors: Jimin Zhang, San Jose, CA (US); Brian J. Brown, Palo Alto, CA (US); Eric Lau, Santa Clara, CA (US); Ekaterina Mikhaylichenko, San Jose, CA (US); Jeonghoon Oh, Saratoga, CA (US); Gerald J. Alonzo, Los Gatos, CA (US)

(73) Assignee: Applied Materials, Inc., Santa Clara, CA (US)

(*) Notice: Subject to any disclaimer, the term of this patent is extended or adjusted under 35 U.S.C. 154(b) by 14 days.

(21) Appl. No.: 17/335,868

(22) Filed: Jun. 1, 2021

(65) Prior Publication Data
US 2022/0379428 A1 Dec. 1, 2022

(51) Int. Cl.
H01L 21/321 (2006.01)
B24B 37/10 (2012.01)
H01L 21/306 (2006.01)
B24B 37/04 (2012.01)

(52) U.S. Cl.
CPC ........ H01L 21/3212 (2013.01); B24B 37/042 (2013.01); B24B 37/107 (2013.01); H01L 21/30625 (2013.01)

(58) Field of Classification Search
CPC .......... H01L 21/3212; H01L 21/30625; B24B 37/042; B24B 37/107

USPC ................................................. 438/690–693
See application file for complete search history.

(56) References Cited

U.S. PATENT DOCUMENTS

| | | | |
|---|---|---|---|
| 9,496,190 B2 | 11/2016 | Xu et al. | |
| 10,256,111 B2 | 4/2019 | Lau et al. | |
| 2002/0037685 A1* | 3/2002 | Matsuo | B24B 37/042 451/60 |
| 2003/0064594 A1* | 4/2003 | Delage | B24B 37/042 438/691 |
| 2016/0207162 A1* | 7/2016 | Shinozaki | B24B 53/005 |

(Continued)

FOREIGN PATENT DOCUMENTS

| | | |
|---|---|---|
| EP | 0888846 B1 | 5/2003 |
| JP | 2000271859 A | 10/2000 |
| JP | 2001085377 A | 3/2001 |

OTHER PUBLICATIONS

International Search Report and Written Opinion dated Sep. 19, 2022 for Application No. PCT/US2022/031093.

(Continued)

*Primary Examiner* — Duy Vu N Deo
(74) *Attorney, Agent, or Firm* — PATTERSON & SHERIDAN, LLP

(57) ABSTRACT

Certain aspects of the present disclosure provide techniques for a method of removing material on a substrate. An exemplary method includes rotating a substrate about a first axis in a first direction and urging a surface of the substrate against a polishing surface of a polishing pad while rotating the substrate, wherein rotating the substrate about the first axis includes rotating the substrate a first angle at a first rotation rate, and then rotating the substrate a second angle at a second rotation rate, and the first rotation rate is different from the second rotation rate.

18 Claims, 11 Drawing Sheets

(56) References Cited

U.S. PATENT DOCUMENTS

| | | |
|---|---|---|
| 2018/0264619 A1* | 9/2018 | Yoshida ................. B24B 37/34 |
| 2020/0156206 A1 | 5/2020 | Zuniga et al. |
| 2020/0282509 A1* | 9/2020 | Zhang ................. H01L 21/3212 |
| 2020/0331117 A1 | 10/2020 | Wu et al. |
| 2021/0154796 A1 | 5/2021 | Zhang et al. |

OTHER PUBLICATIONS

Jiun-Yu Lai et al. "Mechanics, Mechanisms, and Modeling of the Chemical Mechanical Polishing Process", Massachusetts Institute of Technology, Feb. 2001.

Krzysztof D. Kopanski, "Analysis of Slurry Flow in, Chemical-Mechanical Polishing", Massachusetts Institute of Technology, Jun. 2005.

* cited by examiner

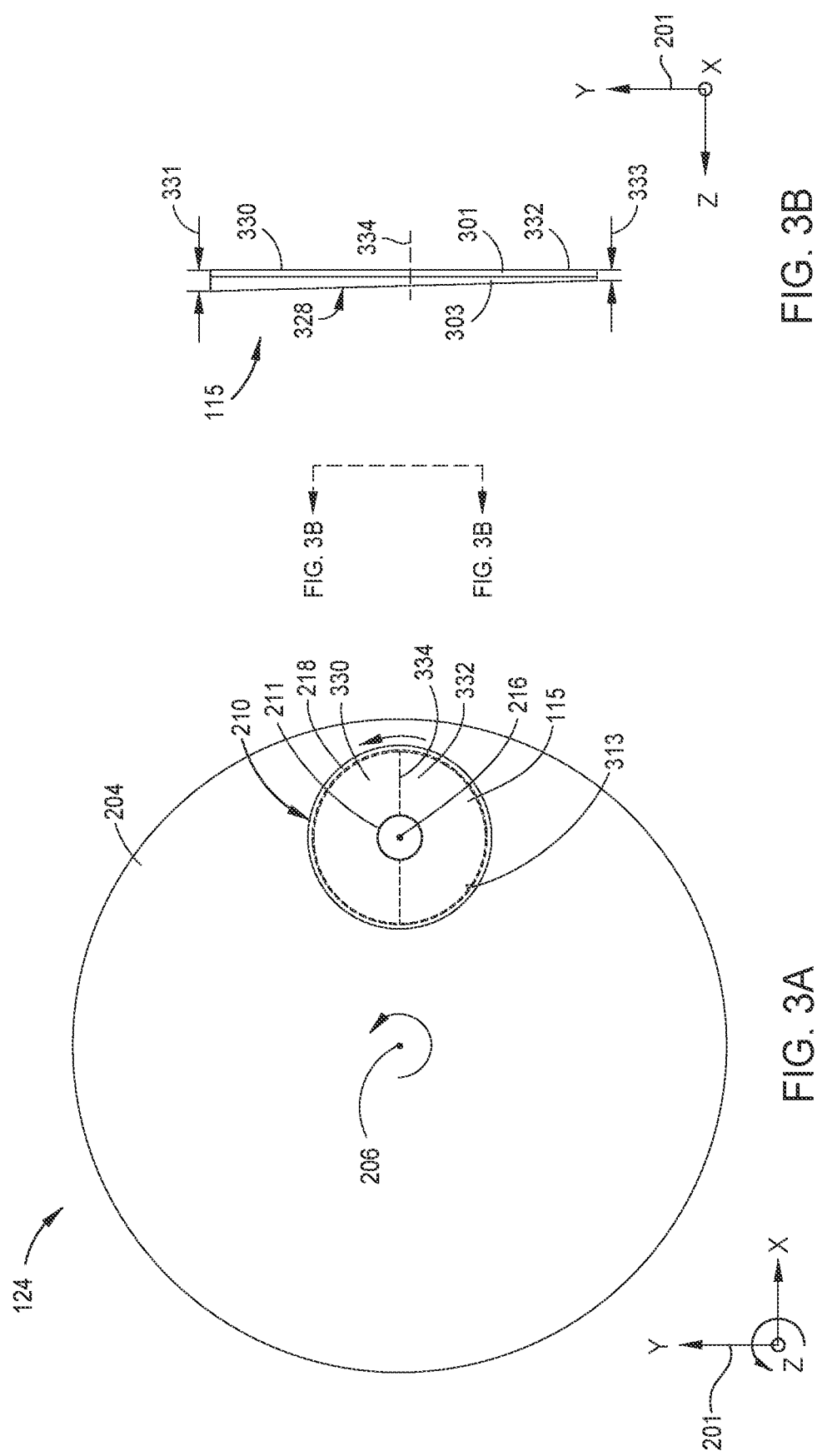

ASYMMETRY CORRECTION VIA VARIABLE RELATIVE VELOCITY OF A WAFER

FIELD OF INVENTION

The present disclosure relates to chemical mechanical polishing (CMP), and more specifically to correcting thickness asymmetry during CMP.

BACKGROUND

An integrated circuit is typically formed on a substrate by the sequential deposition of conductive, semiconductive, or insulative layers on a semiconductor substrate. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill trenches and holes in the insulative layer. After planarization, the remaining portions of the metal in the trenches and holes of the patterned layer form vias, plugs, and lines to provide conductive paths between integrated circuits (ICs) on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate, the surface with the layer deposition, is typically placed against a rotating polishing pad. The carrier head provides a controllable load on the substrate to urge it against the polishing pad. A polishing slurry with abrasive particles is typically supplied to the surface of the polishing pad and spreads in between the substrate and the polishing pad. The polishing pad and the carrier head each rotate at a constant rotational speed and the abrasive slurry removes material from one or more of the layers. Material is removed in a planar fashion and the material removal process is symmetric about a central axis. The symmetric removal process may be problematic because a substrate having an asymmetrically non-uniform thickness profile will remain asymmetric after the CMP process is complete. For example, the asymmetric thickness of the substrate may result in the circuits formed on a surface of the substrate having a different RC time constant for the integrated circuits in devices formed on opposing sides of the same surface of the substrate, due to the ICs formed on the thinner edge of the substrate having less metal than the ICs formed on the thicker edge of the substrate. The resulting integrated circuits will have processing speeds that vary based on the corresponding substrate thickness. Thus, the variance in RC time constants results in devices of varying quality, which is not desirable. Although described as on opposing sides or edges, the location of the thinnest and thickest sides or areas of the substrate may be in other locations of the substrate.

Accordingly, there is a need in the art for methods of correcting asymmetry in substrates during CMP.

SUMMARY

Embodiments of the present disclosure generally relate to polishing a substrate by use of a chemical mechanical polishing (CMP) process. In particular, embodiments herein provide methods for correcting asymmetry in a thickness profile of the substrate by use of a CMP process.

In one embodiment, a method of removing material on a substrate is provided. Generally, the method includes rotating a substrate about a first axis in a first direction and urging a surface of the substrate against a polishing surface of a polishing pad while rotating the substrate. Rotating the substrate about the first axis includes rotating the substrate a first angle at a first rotation velocity profile, and then rotating the substrate a second angle at a second rotation velocity profile. The first rotation velocity profile is different from the second rotation velocity profile.

In another embodiment, a method of removing material on a substrate is provided. Generally, the method includes rotating a substrate about a first axis in a first direction and urging a surface of the substrate against a polishing surface of a polishing pad while rotating the substrate about the first axis. Rotating the substrate about the first axis includes rotating the substrate a 180 degrees or less within a 360 degree rotation at a first rotation velocity profile, then rotating the substrate a 180 degrees or less within the 360 degree rotation at a second rotation velocity profile, wherein the second rotation velocity profile is different from the first rotation velocity profile, and repeating the first and second rotation velocity profiles at least one more time.

In another embodiment, a non-transitory computer readable medium includes computer-executable instructions that, when executed by a processing system, cause the processing system to perform a method of removing material on a substrate. Generally, the method includes rotating a substrate about a first axis in a first direction and urging a surface of the substrate against a polishing surface of a polishing pad while rotating the substrate. Rotating the substrate about the first axis includes rotating the substrate a first angle at a first rotation velocity profile, and then rotating the substrate a second angle at a second rotation velocity profile. The first rotation velocity profile is different from the second rotation velocity profile.

Embodiments of the disclosure may further provide a method of removing material on a substrate, comprising orienting a substrate according to a thickness profile, receiving, by a carrier head, the oriented substrate, and aligning the substrate to known position in the carrier head, wherein the carrier head is configured to perform the process of urging a surface of the substrate against a polishing surface of a polishing pad while rotating the substrate about a first axis, wherein rotating the substrate about the first axis comprises rotating the substrate at different rotational speeds based off the alignment of the substrate. Orienting the substrate according to the thickness profile comprises aligning the substrate based on a maximum thickness of the substrate. In one example, the maximum thickness of the substrate is at a first radius of the substrate and the maximum thickness is rotated at a higher relative velocity than other locations on the first radius during the performance of the method.

Embodiments of the disclosure may further provide a chemical mechanical polishing system, comprising a carrier head having a first rotational axis, a polishing pad disposed on a surface of a platen, wherein the platen has a second rotational axis, and a non-transitory computer readable medium comprising computer-executable instructions. The computer-executable instructions, when executed by a processing system, cause the processing system to perform a method of removing material on a substrate, the method comprising rotating the carrier head about the first rotational axis in a first direction, and urging, by use of the carrier head, a surface of the substrate against a polishing surface of the polishing pad while rotating the substrate about the first rotational axis, wherein rotating the substrate about the first rotational axis comprises rotating the substrate a first angle at a first rotation velocity profile, and then rotating the substrate a second angle at a second rotation velocity profile, and the first rotation velocity profile is different from the second rotation velocity profile.

Embodiments of the disclosure may further provide a method of removing material on a substrate, comprising rotating a substrate about a first axis in a first direction, and urging a surface of the substrate against a polishing surface of a polishing pad while rotating the substrate about the first axis. Rotating the substrate about the first axis comprises: (a) rotating the substrate a 180 degrees or less within a 360 degree rotation at a first rotation velocity profile; (b) then rotating the substrate a 180 degrees or less within the 360 degree rotation at a second rotation velocity profile, wherein the second rotation velocity profile is different from the first rotation velocity profile; and (c) repeating (a) and (b) at least one more time.

Embodiments of the disclosure may further provide a method of removing material on a substrate, comprising rotating a substrate about a first axis in a first direction, and urging a surface of the substrate against a polishing surface of a polishing pad while rotating the substrate. Rotating the substrate about the first axis comprises rotating the substrate a first angle at a first rotation velocity profile, and then rotating the substrate a second angle at a second rotation velocity profile, and the first rotation velocity profile is different from the second rotation velocity profile.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A depicts a schematic top view of the carrier head positioned on the polishing pad from the polishing station of FIG. 2 according to embodiments described herein.

FIG. 3B depicts a schematic side view of the substrate from FIG. 3A according to embodiments described herein.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Figure 1:
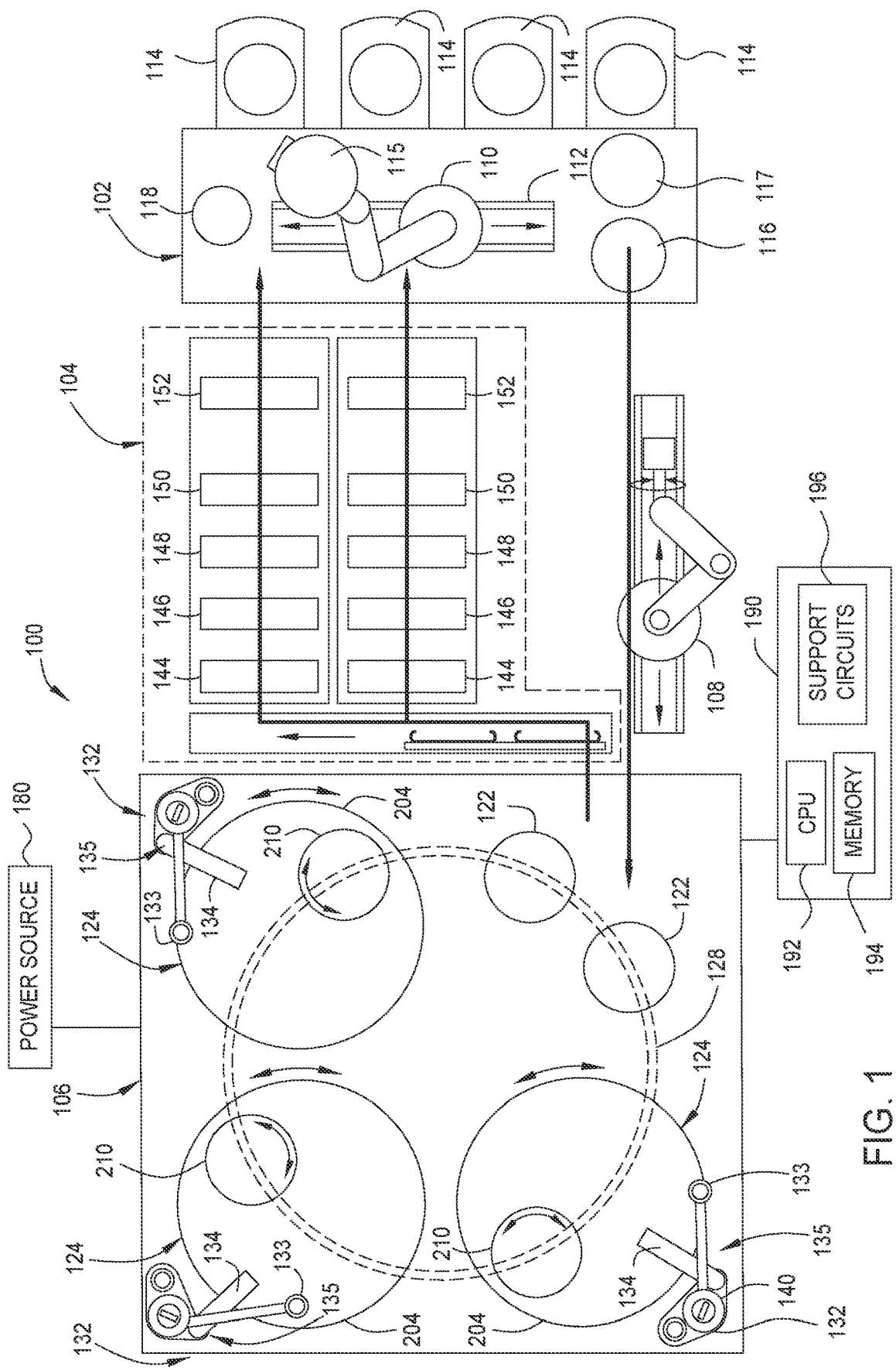
FIG. 1 depicts a schematic top view of an exemplary chemical mechanical polishing (CMP) system.

In the following description, details are set forth by way of example to facilitate an understanding of the disclosed subject matter. It should be apparent to a person of ordinary skill in the field, however, that the disclosed implementations are exemplary and not exhaustive of all possible implementations. Thus, it should be understood that reference to the described examples is not intended to limit the scope of the disclosure. Any alterations and further modifications to the described devices, instruments, methods, and any further application of the principles of the present disclosure are fully contemplated as would normally occur to one skilled in the art to which the disclosure relates. In particular, it is fully contemplated that the features, components, and/or steps described with respect to one implementation may be combined with the features, components, and/or steps described with respect to other implementations of the present disclosure. As used herein, the term "about" may refer to a +/−10% variation from the nominal value. It is to be understood that such a variation can be included in any value provided herein.

Aspects of the present disclosure provide apparatuses, methods, processing systems, and computer readable mediums for correcting asymmetry in a thickness profile by use of a chemical mechanical polishing (CMP) process.

In certain polishing systems, a platen and a carrier head are used and a polishing pad is disposed on and affixed to the platen. A substrate to be polished is placed between the carrier head and the polishing pad. The carrier head and/or the platen and the polishing pad rotate as a slurry containing abrasive particles is applied to the surface of the polishing pad. A membrane in the carrier head is used to apply pressure on the substrate during polishing to adjust the material removal rate and control the planarization and uniformity results achieved on the substrate. However, prior to being polished, the substrate may have an initial asymmetrical, non-uniform thickness profile which, by use of conventional CMP processes, results in the asymmetric thickness profile being unchanged during and after polishing due to the symmetric material removal rate provided in the conventional CMP process. As discussed further below, in order to counteract the initial asymmetric thickness profile, an asymmetric removal profile is created by use of one or more of the embodiments described herein. The asymmetric removal profile, when known, combined with the substrate's initial asymmetric thickness profile can result in a polished substrate having a final thickness profile that is highly symmetric.

The substrate's initial thickness profile may be determined using different measurement or metrology tools and methods. Measurements may be taken manually, such as with a granite table and measuring height gauge, or automatically, such as with an automated system. Measurements may be taken using contact methods, such as those using gauges, or non-contact methods, such as those using lasers or optics. In certain embodiments, a metrology station may be used to measure the thickness profile. The thickness profile may be referenced to a feature or marking on the substrate through a reference mapping. For example, the substrate may include a V-shaped notch (e.g., a notch 313 in FIG. 3A) in its perimeter or edge and the orientation of the thickness profile is noted or logged in reference to the notch. As is discussed further below, the reference mapping is used when developing the asymmetric removal profile.

In one or more of the embodiments of the disclosure provided herein, an asymmetric removal profile may be achieved by varying the rotational speeds of the carrier head and/or a polishing pad during processing. When the polishing pad and the carrier head rotate at constant rotational speeds, a relative velocity of a point on a radius of the substrate will be the same, on average, as any other point on the radius. For example, the average relative velocity of a point on the perimeter of the substrate is the same as every other point on the perimeter. While one of many polishing process variables, the use of a constant average relative velocity tends to promote the generation of a symmetric removal profile. As is discussed further below, by varying the rotational speed of the carrier head and/or the polishing pad and platen during processing, the relative velocity of different points on the radius of the substrate may be adjusted so that the relative velocities differ from one another so that an asymmetric removal profile can be created.

The asymmetric removal profile is used to correct one or more material thickness asymmetries in the substrate. In an effort to form a desirable asymmetric removal profile, in certain embodiments, the rotational speed of the polishing pad may be held at a constant value while the rotational speed of the carrier head may vary with an angular rotational position of the carrier head. It is believed that varying the rotational speed at different rotational angles can create a desirable asymmetric removal profile. When properly aligned, the asymmetric removal profile and the substrate's asymmetric thickness profile may at least partially cancel each other out, thus reducing or removing the asymmetry in the final substrate thickness profile.

Figure 2:
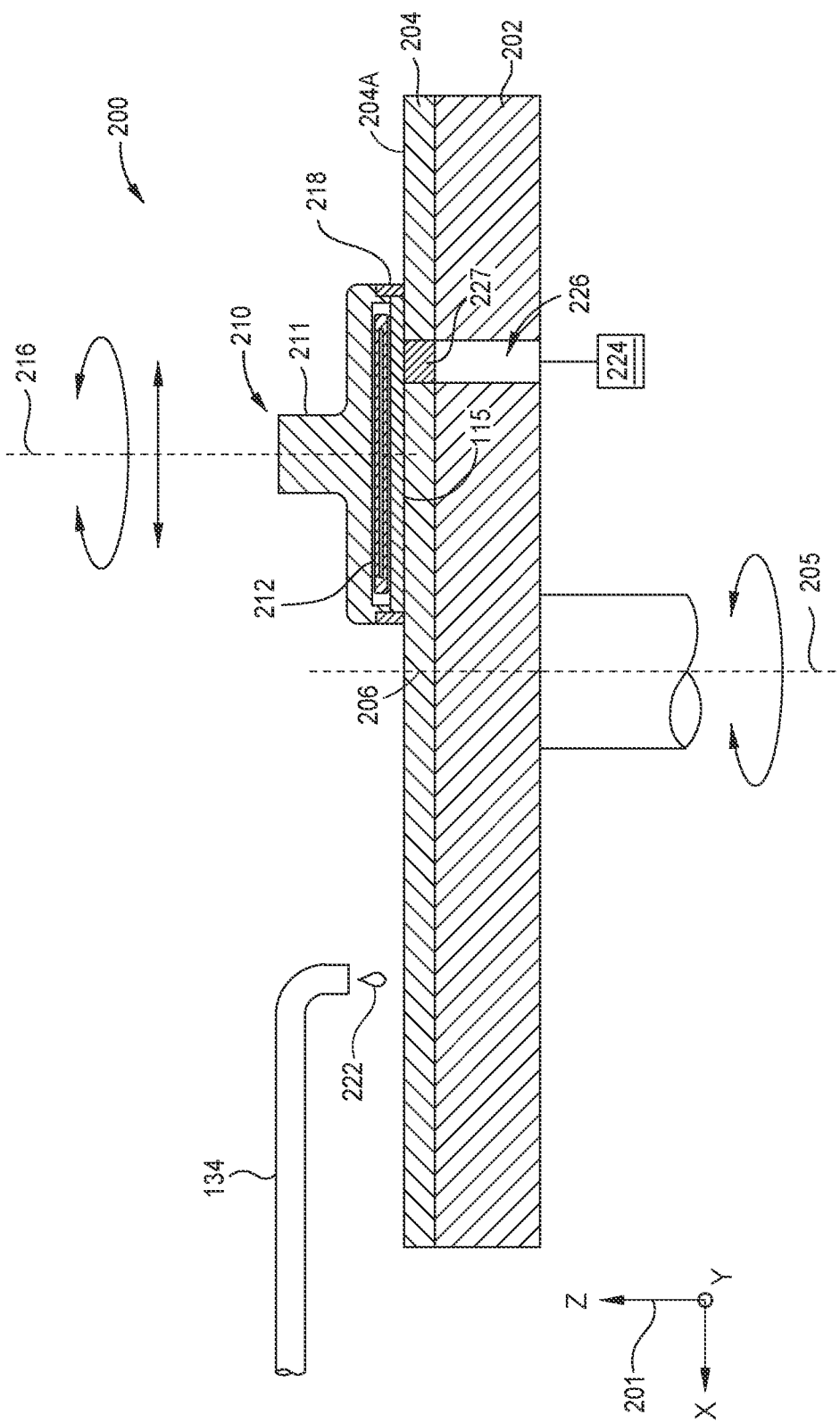
FIG. 2 depicts a schematic sectional view of an exemplary polishing station of the CMP system from FIG. 1 according to embodiments described herein.

This application often refers to a rotation, rotational rate, rotational speed, speed, and/or velocity in relation to the motion of the carrier head 210 (FIG. 2). However, it should be understood that such discussion also will similarly apply to the substrate 115, unless otherwise noted, because the substrate 115 is in contact with and rotates with the carrier head 210. The application refers to rotational speeds, rotational rates, speeds, and velocities. However, these terms are not meant to be limiting and may be used interchangeably unless specifically noted. For example, velocity may mean a velocity with a speed and a direction or a magnitude of a velocity (e.g., speed).

Example System for Asymmetry Correction

FIG. 1 is a top plan view illustrating one embodiment of a chemical mechanical polishing ("CMP") system 100. The CMP system 100 includes a factory interface module 102, a cleaner 104, and a polishing module 106. A wet robot 108 is provided to transfer the substrates 115 between the factory interface module 102 and the polishing module 106. The wet robot 108 may also be configured to transfer the substrates 115 between the polishing module 106 and the cleaner 104. The factory interface module 102 includes a dry robot 110 which is configured to transfer the substrates 115 between one or more cassettes 114, one or more metrology stations 117, and one or more transfer platforms 116. In one embodiment depicted in FIG. 1, four substrate storage cassettes 114 are shown. The dry robot 110 within the factory interface 102 has sufficient range of motion to facilitate transfer between the four cassettes 114 and the one or more transfer platforms 116. Optionally, the dry robot 110 may be mounted on a rail or track 112 to position the robot 110 laterally within the factory interface module 102. The dry robot 110 additionally is configured to receive the substrates 115 from the cleaner 104 and return the clean polished substrates to the substrate storage cassettes 114.

Still referring to FIG. 1, the polishing module 106 includes a plurality of polishing stations 124 on which the substrates 115 are polished while being retained in a carrier head 210. The polishing stations 124 are sized to interface with one or more carrier heads 210 so that polishing of a substrate 115 may occur in a single polishing station 124. The carrier heads 210 are coupled to a carriage (not shown) that is mounted to an overhead track 128 that is shown in phantom in FIG. 1. The overhead track 128 allows the carriage to be selectively positioned around the polishing module 106 which facilitates positioning of the carrier heads 210 selectively over the polishing stations 124 and load cup 122. In the embodiment depicted in FIG. 1, the overhead track 128 has a circular configuration which allows the carriages retaining the carrier heads 210 to be selectively and independently rotated over and/or clear of the load cups 122 and the polishing stations 124.

In one embodiment, as depicted in FIG. 1, three polishing stations 124 are shown located in the polishing module 106. At least one load cup 122 is in the corner of the polishing module 106 between the polishing stations 124 closest to the wet robot 108. The load cup 122 facilitates transfer between the wet robot 108 and the carrier heads 210.

Each polishing station 124 includes a polishing pad 204 having a polishing surface (e.g., a polishing surface 204A in FIG. 2) capable of polishing a substrate 115. Each polishing station 124 includes one or more carrier heads 210, a conditioning assembly 132 and a polishing fluid delivery module 135. In one embodiment, the conditioning assembly 132 may comprise a pad conditioning assembly 140 which dresses the polishing surface of the polishing pad 204 by removing polishing debris and opening the pores of the polishing pad 204 by use of a pad condition disk 133. In another embodiment, the polishing fluid delivery module 135 may comprise a fluid delivery arm 134 to deliver a slurry. In one embodiment, each polishing station 124 comprises a pad conditioning assembly 132. In one embodiment, the fluid delivery arm 134 is configured to deliver a fluid stream (e.g., a fluid 222 in FIG. 2) to a polishing station 124. The polishing pad 204 is supported on a platen (e.g., a platen 202 in FIG. 2) which rotates the polishing surface during processing. The CMP system 100 is coupled with a power source 180.

In certain embodiments, the substrates 115, such as silicon wafers with one or more layers deposited thereon, are loaded into the CMP system 100 via a cassette 114. The substrate 115 will typically have a notch, flat or other type of reference mark that can be used to note a rotational orientation of a major surface of the substrate relative to a central axis. The factory interface module 102 extracts the substrate 115 from the cassette 114 to begin processing while a controller 190 coordinates operations of the CMP system 100. The factory interface module 102 transfers the substrate 115 to the metrology station 117, which measures a thickness profile of the substrate 115 and determines the orientation of the thickness profile in relation to the notch of the substrate 115. The metrology station 117 may use an optical, eddy current, resistive or other useful process as described in relation to FIG. 2. The controller 190 receives the measurements and the orientation of the thickness profile from the metrology station 117 and tracks the orientation of the thickness profile using the notch as the substrate 115 is processed. The factory interface module 102 transfers the substrate 115 to the transfer platforms 116, and the wet robot 108 transfers the substrates through subsequent processing components including the CMP system 100.

The load cups 122 serve multiple functions, including receiving the substrate 115 from the wet robot 108, washing the substrate 115 and loading the substrate 115 into the carrier heads (e.g., a carrier head 210 in FIG. 2). Each polishing station includes a polishing pad 204 secured to a rotatable platen 202. Different polishing pads 204 may be used at different polishing stations 124 to control the material removal of the substrate 115. Aspects of the CMP system operation are further described in FIG. 2.

In certain embodiments, the factory interface module 102 can also include a pre-aligner 118 to position the substrate 115 in a known and desirable rotational orientation. The pre-alignment of the substrate to a desired rotational orientation allows the substrate to be positioned and oriented so that when the substrate is transferred by one or more robots in the system to a position where a carrier head 210 can receive the substrate, the substrate is oriented in a known and desirable orientation relative to the carrier heads 210 and rotatable platen 202. The pre-aligner 118 includes a notch detection system, such as an optical interrupter sensor (not shown), to sense when the substrate notch is at a specific angular position. Substrates 115 which might be in an uncertain angular position, e.g., after a polishing operation, have a known orientation when scanned by the metrology station 117, thus permitting accurate determination of the x-y (or r-θ) position of the measurements on the substrate 115.

In certain embodiments, the substrates 115 are moved by the dry robot 110 to the metrology station 117 where properties of the substrate 115 are measured, such as thickness uniformity and/or thickness of the substrate as a function of angular orientation relative to a reference mark, such as the notch. For example, the factory dry robot 110 "picks" up the substrate, e.g., by vacuum suction, and transports the unpolished substrate to the metrology station 117. The metrology station 117 may perform a plurality of thickness or flatness measurements across the substrate 115. The controller 190 may determine that the thickness and/or flatness of the substrate 115 is asymmetrical, e.g., thicker on one side than an opposite side. For example, the controller 190 determines the thickness profile of the substrate, e.g., a three-dimensional (3D) map of the substrate thickness. Metrology stations 117 suitable for measuring the thickness are available from Nanometrics and Nova Measuring Instruments.

The dry robot 110 then transfers each substrate 115 to a transfer platform 116, and then the wet robot 108 transports the substrate to the different polishing stations 124 within the CMP system 100. Eventually the substrate 115 is loaded into a load cup 122 so that a carrier head 210 can retain and transport the substrate 115 to each of the one or more polishing stations 124 to undergo a CMP process according to the polishing parameters selected. During CMP, the controller 190 controls aspects of the polishing stations 124. In certain embodiments, the controller 190 is one or more programmable digital computers executing digital control software. The controller 190 can include a processor 192 situated near the polishing apparatus, e.g., a programmable computer, such as a personal computer. The controller can include a memory 194 and support circuits 196. The controller 190 can, for example, coordinate rotation of the polishing pad and the carrier head such that an asymmetric removal profile is aligned with an asymmetric thickness profile of the substrate 115. Aligning these profiles ensures the thickest part of the substrate 115 has the most material removed and reduces the asymmetry of the substrate 115 during polishing. The controller 190 is further described in FIG. 6.

After polishing, the wet robot 108 transports the substrate 115 from the load cup 122 to a cleaning chamber in the cleaner 104, where slurry and other contaminants that have accumulated on the substrate surface during polishing are removed. In the embodiment depicted in FIG. 1, the cleaner 104 includes two pre-clean modules 144, two megasonic cleaner modules 146, two brush box modules 148, a spray jet module 150, and two dryers 152.

The dry robot 110 then removes the substrate 115 from the cleaner 104 and transfers the substrate 115 to the metrology station 117 to be measured again. In certain embodiments, the post-polish layer thickness measurements can be used to adjust the polishing process parameters for a subsequent substrate. Finally, the dry robot 110 returns the substrate 115 to one of the cassettes 114.

In certain embodiments, the metrology station 117 is part of the factory interface module 102. In certain embodiments, the metrology station 117 is housed in a separate module (not shown) connected to the factory interface module 102.

FIG. 2 depicts a schematic sectional view of a polishing station 124 of the CMP system 100 from FIG. 1 that comprises a polishing assembly 200 having a polishing pad 204 formed according to embodiments described herein. In particular, FIG. 2 shows how a carrier head 210 is positioned relative to the polishing pad 204. A coordinate system 201, having an x-axis, a y-axis, and a z-axis, shows the orientation of the different components of the polishing assembly 200 in this and subsequent figures. The coordinate system 201 shows positive directions of the x, y, and z-axes and positive direction for rotation about the z-axis, which is in a counter-clockwise direction. The opposite directions (not shown) are negative directions.

In certain embodiments, the polishing pad 204 is secured to a platen 202 using an adhesive, such as a pressure sensitive adhesive (PSA) layer (not shown), disposed between the polishing pad 204 and the platen 202. The carrier head 210, facing the platen 202 and the polishing pad 204 mounted thereon, includes a flexible diaphragm 212 configured to impose different pressures against a surface of a substrate 115 that is disposed between the carrier head 210 and the polishing pad 204. The carrier head 210 includes a carrier ring 218 surrounding the substrate 115 which holds the substrate in place. The carrier head 210 rotates about a carrier head axis 216 while the flexible diaphragm 212 urges a to-be-polished surface of the substrate 115 against a polishing surface 204A of the polishing pad 204. During polishing, a downforce on the carrier ring 218 urges the carrier ring 218 against the polishing pad 204 to improve the polishing process uniformity and prevent the substrate 115 from slipping out from under the carrier head 210. In certain embodiments, the carrier head 210 includes a shaft 211 which has an axis that is colinear with carrier head axis 216. In certain embodiments, the platen 202 and the carrier head 210 each have a rotation sensor (not shown), such as an encoder, to measure their angular position and/or rotation rate as they rotate. In further embodiments, the platen 202 and the carrier head 210 each have a mechanism or motor (not shown) driving their rotation. The encoder and the motor may be integrated into a controller as an input and an output, respectively, as further discussed in FIG. 6. In further embodiments, the controller may calculate a rotation rate of the carrier head 210 and/or platen 202 and polishing pad 204 using the encoder and an internal timing element.

In certain embodiments, the polishing pad 204 rotates about a platen axis 205. In certain embodiments, the polishing pad 204 has a polishing pad axis 206 that is colinear with the platen axis 205. In certain embodiments, the polishing pad 204 rotates in the same rotational direction as the rotation direction of the carrier head 210. For example, the polishing pad 204 and carrier head 210 both rotate in a counter-clockwise direction as discussed in FIG. 3. As shown in FIG. 2, the polishing pad 204 has a surface area that is greater than the to-be-polished surface area of the substrate 115. However, in further embodiments, the polishing pad 204 has a surface area that is less than the to-be-polished surface area of the substrate 115.

This application often refers to the platen 202 and the platen axis 205, including a rotation rate of the platen 202 and the platen axis 205. However, it should be understood that such discussion also will similarly apply to the polishing pad 204 and the polishing pad axis 206, unless otherwise noted, because in certain embodiments the polishing pad 204 and the platen 202 rotate as one and the polishing pad axis 206 and the platen axis 205 are colinear.

In some embodiments, an endpoint detection (EPD) system 224 directs light towards the substrate 115 through a platen opening 226 and further through an optically transparent window feature 227 of the polishing pad 204 disposed over the platen opening 226 during processing to detect properties of the substrate during polishing. The EPD system 224 allows a thickness measurement of the substrate 115 to be taken while the polishing assembly 200 is in use. In further embodiments, an eddy current probe is used to measure the thickness of conductive layers formed on a surface of the substrate 115.

Notably, this application may refer to a rotation, rotation rate, speed, and/or velocity of the carrier head 210. It should be understood that such discussion also applies to the substrate 115, unless otherwise noted, because the substrate 115 generally rotates with the carrier head 210.

During polishing, the fluid 222 is introduced to the polishing pad 204 through the fluid delivery arm 134 portion of the polishing fluid delivery module 135, which is positioned over the polishing pad 204. In certain embodiments, the fluid 222 is a polishing fluid, a polishing slurry, a cleaning fluid, or a combination thereof. In certain embodiments, the polishing fluid may include water based chemistries that include an abrasive particles. The fluid 222 may also include a pH adjuster and/or chemically active components, such as an oxidizing agent, to enable CMP of the material surface of the substrate 115 in conjunction with the polishing pad 204. In certain embodiments, the fluid 222 removes material from the substrate as the carrier head 210 urges the substrate against the polishing pad 204.

FIG. 3A depicts a schematic top view of the carrier head 210 positioned on the polishing pad 204 from the polishing assembly 200 of FIG. 2 according to embodiments described herein. In particular, FIG. 3A shows one example of how the carrier head 210 and the polishing pad 204 rotate relative to another. The substrate 115 and the carrier ring 218 are shown as phantom lines because they are hidden under the carrier head 210 in this view.

In certain embodiments, the substrate 115 has an asymmetric thickness profile 328 as previously discussed in relation to FIG. 1. In one configuration, as shown in FIG. 3B, the substrate 115 includes a base substrate 301 (e.g., single crystal or poly crystalline silicon substrate) that has a deposited layer 303 formed thereon. In this example, due to the performance of prior semiconductor device processing steps, the deposited layer 303 (e.g., metal or dielectric layer) includes a varying film thickness that has created the asymmetric thickness profile 328. The asymmetric thickness profile 328 has a thicker portion 330 and a thinner portion 332. The portions 330 and 332 are demarcated by a dividing line 334, which is shown as a phantom line in FIG. 3A for illustrative purposes and is not physically present on the substrate 115. The asymmetric thickness profile 328 is further discussed in FIG. 3B.

The substrate 115 has a notch 313 such as the V-shaped notch previously discussed in FIG. 1. The notch 313 typically indicates an orientation of a crystallographic plane formed in the substrate 115 and can further be used to orient the substrate 115 during processing. For example, the asymmetric thickness profile 328 is noted, logged, or stored in a memory in reference to the notch 313 such that the location and the orientation of the thicker portion 330 and the thinner portion 332 are known during processing of the substrate 115. A controller (e.g., the controller 190 in FIG. 1) may be used to track the orientation of the asymmetric thickness profile 328 as the substrate 115 is processed as previously discussed in FIG. 1.

As shown in FIG. 3A, the polishing pad 204 and the carrier head 210 both rotate in a counter-clockwise direction. In certain embodiments, the polishing pad 204 and the carrier head 210 both rotate in a clockwise direction. In other embodiments, the polishing pad 204 and the carrier head 210 rotate in opposite directions. For example, the polishing pad 204 rotates in a clockwise direction and the carrier head 210 rotates in a counter-clockwise direction. The polishing pad 204 rotates with the platen 202 and the substrate 115 rotates with the carrier head 210. Although described with respect to FIG. 3A, the rotational directions of the polishing pad 204 and the carrier head 210 may apply to any figure and/or embodiment disclosed herein.

In FIG. 3A, the polishing pad axis 206 and the carrier head axis 216 are substantially parallel and non-colinear. In other embodiments, the carrier head 210 is in a different location relative to the polishing pad axis 206.

In other embodiments, during polishing, the carrier head 210 sweeps back and forth along an x-axis of coordinate system 201, from an inner diameter of the polishing pad 204 to an outer diameter of the polishing pad 204 to, in part, to improve polishing uniformity and reduce uneven wear of the substrate 115. In some embodiments, the carrier head 210 sweeps up and down a y-axis of coordinate system 201 during polishing. In some embodiments, the carrier head 210 sweeps about the polishing pad axis 206 during polishing. In other embodiments, the polishing pad 204 sweeps during polishing while the carrier head 210 does not sweep. In other embodiments, the polishing pad 204 and the carrier head 210 sweep during polishing. In general, the sweep of the carrier head 210 across the platen will also have an effect on the relative velocity calculations at any instant in time, and thus may be compensated for in one or more of the methods disclosed herein.

FIG. 3B depicts a schematic side view of the substrate 115 according to embodiments described herein. In particular, FIG. 3B shows the asymmetric thickness profile 328 of the substrate 115.

In this embodiment, the dividing line 334 is shown such that the surface area of the thinner portion 332 and the thicker portion 330 are equal. In certain embodiments, the surface areas of the thinner portion 332 and the thicker portion 330 are not equal. In this embodiment, and the one depicted in FIG. 3A, the dividing line 334 is shown as a straight line, but in certain embodiments the dividing line 334 is a different type of line such as an arc, a spline, or a freeform line.

In these embodiments, the asymmetric thickness profile 328 of the substrate 115 has a minimum thickness 333 and a maximum thickness 331. For ease of discussion, it is assumed that the thickness of the substrate 115 increases linearly between the minimum thickness 333 and the maximum thickness 331. However, the assumption that the variation in thickness varies linearly is not intended to be limiting as to the scope of the disclosure provided herein.

In FIGS. 3A and 3B, the minimum thickness 333 and the maximum thickness 331 are located on a perimeter of the substrate 115. In certain embodiments, the peak thicknesses 331 and 333 are not located on the perimeter, and instead are located at another location within the thinner portion 332 and/or the thicker portion 330, respectively.

Figure 4A:
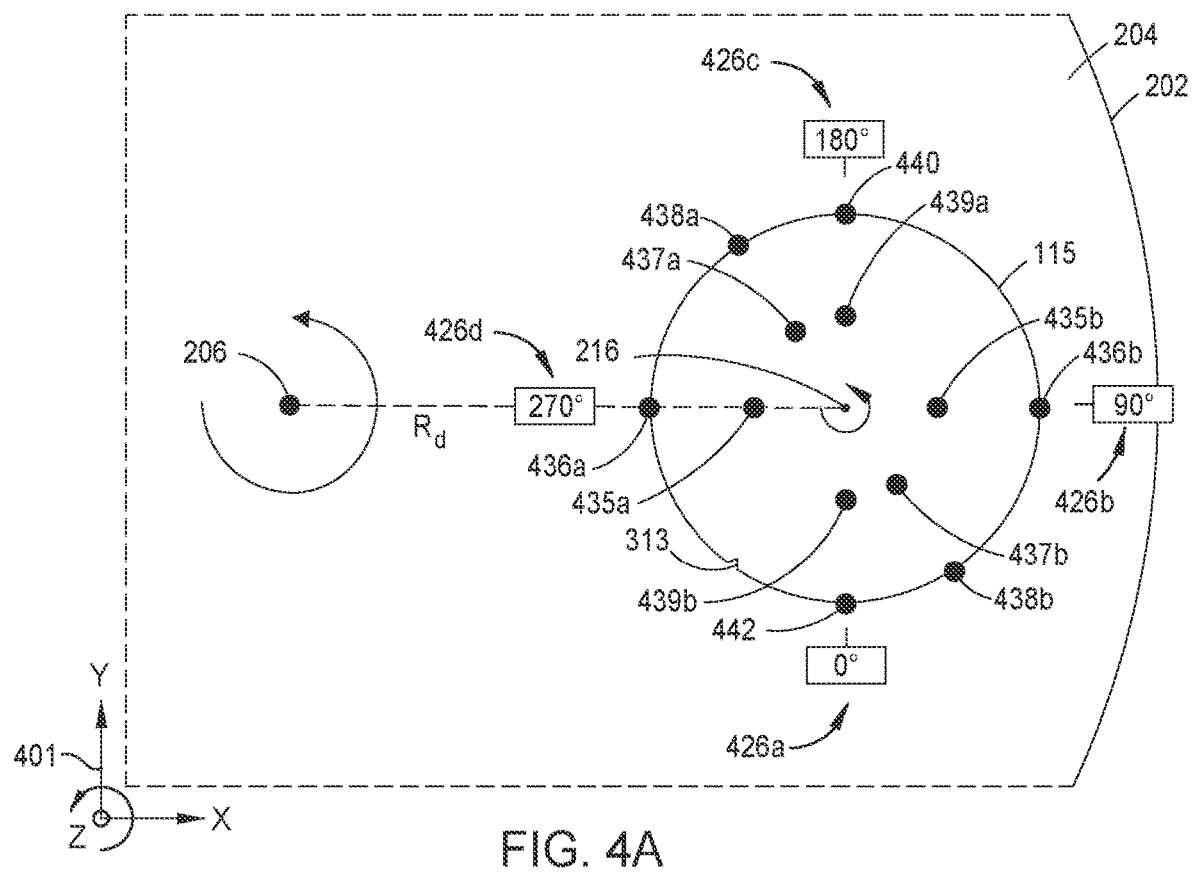
FIGS. 4A-4C depict several points on the substrate and relative velocities of the points according to embodiments described herein.
Figure 4B:
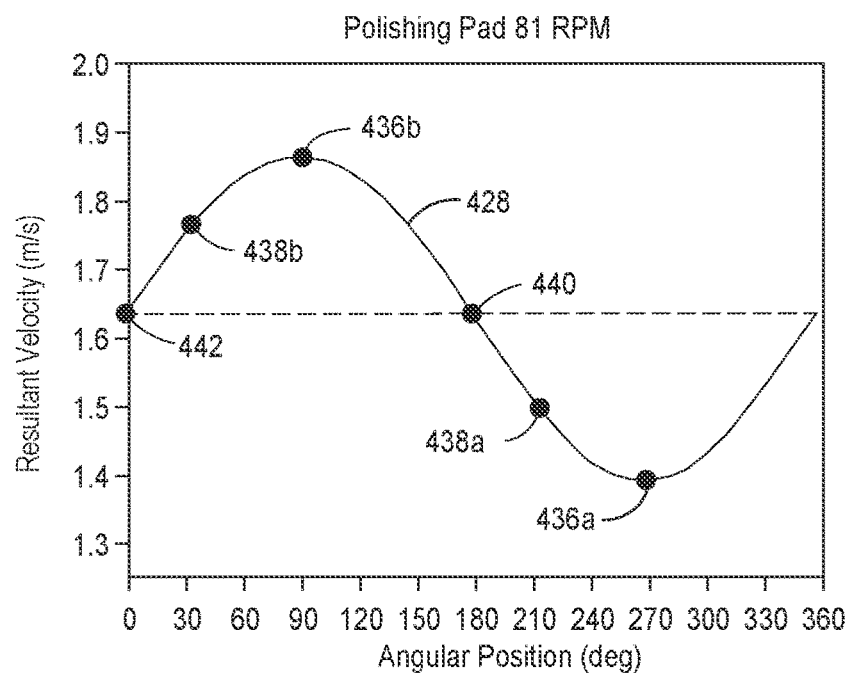
Figure 4C:
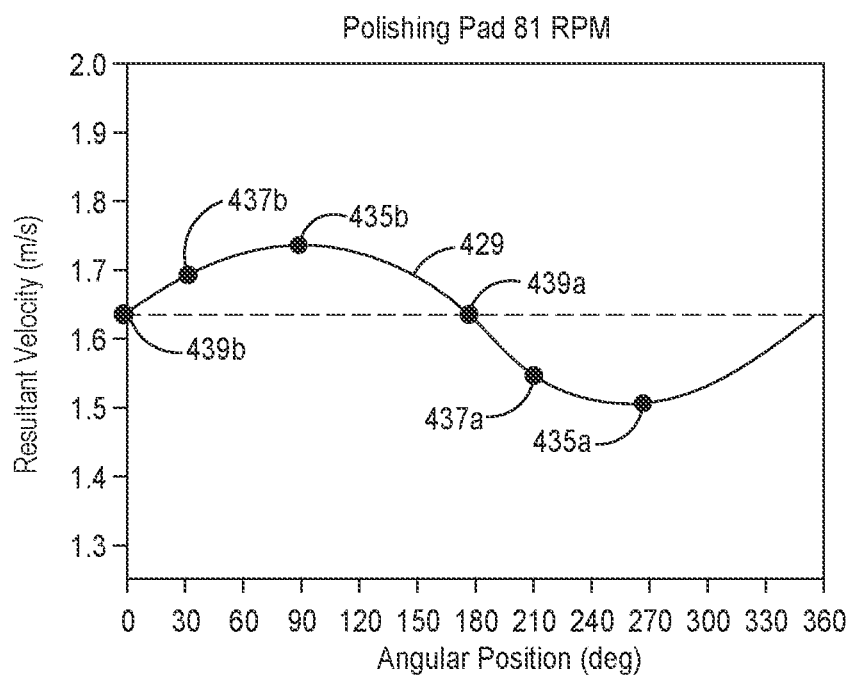

FIGS. 4A-4C depict several points on the substrate 115 and plots of relative velocities of the points according to embodiments described herein. In particular, FIGS. 4A-4C show how the relative velocity of a point on the substrate 115 varies with an angular position and/or a distance (e.g., radius) from the carrier head axis 216. The relative velocity of a point is based on radial and angular velocity components of the substrate 115 and the polishing pad 204 and varies with the radial and angular position of the point. Thus, varying relative velocities may result in different wear rates (e.g., polishing rates) for different portions or points of the substrate 115.

FIG. 4A depicts the location of several points on the substrate 115. The points are depicted in pairs that are on opposite sides (e.g., 180 degrees apart) of the substrate 115 and are the same distance from the carrier head axis 216. For example, a first point 440 and a second point 442 are at opposite ends of the substrate 115 and on the same diameter (e.g., a radial distance from the carrier head axis 216). The following points are also pairs: 435a and 435b, 436a and 436b, 437a and 437b, 438a and 438b, and 439a and 439b, and each pair lies on the same diameter. As shown, the points 436a, 436b, 438a, 438b, 440, and 442 are positioned a first radial distance from the carrier head axis 216 and the points 435a, 435b, 437a, 437b, 439a, and 439b are positioned a second radial distance from the carrier head axis 216. The first radial distance is larger than the second radial distance.

FIG. 4A illustrates several angular positional markers 426 (e.g., an angular positional marker 426a at 0 degrees, an angular positional marker 426b at 90 degree, an angular positional marker 426c at 180 degree, and an angular positional marker 426d at 270 degree angular positions) which convey the angular position of the points. The substrate 115 rotates as part of a system with the carrier head (not shown) and the polishing pad 204 similar to as previously discussed in FIG. 2. As illustrated in FIG. 4A, the carrier head axis 216 is offset a distance 441d (e.g., $R_d$) from the polishing pad axis 206, and thus the rotation of the polishing pad 204 will create a relative velocity between each of the points on the surface of the substrate 115 and their corresponding points on the polishing pad 204 at any instant in time. Parts of the polishing pad 204 and the platen 202 are shown in phantom to indicate that only a portion of the polishing pad 204 and the platen 202 are shown.

In FIG. 4A, the relative velocity of the first point 440 is comprised of the velocity of a point on the polishing pad 204 that is at the position of the first point 440 and the velocity of a point on the carrier head (e.g., the carrier head 210 in FIG. 3A) that is at the position of the first point 440. Thus, rotational rates of the polishing pad 204 and the carrier head each contribute to the relative velocity of the first point 440, and changing either one will result in a different relative velocity which is discussed in relation to FIG. 4D. In the examples discussed in FIGS. 4A-4C, the rotational rate of the polishing pad is 81 revolutions per minute (RPM), and the rotational rate of the carrier head is 66 RPM. In further embodiments, different rotational rates are used for the polishing pad and the carrier head.

Referring to FIG. 4B, the curve 428 represents the relative velocity at all points on the substrate 115 at the first radial distance as a function of angular position. The relative velocities of the points 436a, 436b, 438a, 438b, 440, and 442 are shown on curve 428 according to their angular position. For example, the second point 442 is at 0 degrees and point 438b is at 35 degrees. Thus, FIG. 4B shows one example of the relative velocities at constant rotational rates for the first radial distance.

Notably, the relative velocities along the curve 428 change as the substrate 115 rotates about the carrier head axis 216. For example, as the angular position changes from the second point 442 to point 438b, the relative velocity increases. In this embodiment, the relative velocity continues to increase until a maximum relative velocity is reached at the 90 degree angular positional marker 426b, which coincides with a radial position that extends from polishing pad axis 206, through the carrier head axis 216 and through the point 436b. The relative velocity then decreases as the angular position increases until the relative velocity reaches a minimum value at point 436a and then increases until the angular position reaches point 442 once again. In this example, the rotation rate of the carrier head 210 and substrate 115 is significantly different from the rotation rate of the polishing pad 204 (e.g., carrier head/substrate rotation rate is ≤90% of the polishing pad rotation rate). Therefore, as described further below, even though the velocity vectors at a point on a substrate 115 and point on the polishing pad 204 at point 493 are aligned in the same direction due to the counter-clockwise rotation of both the substrate 115 and the polishing pad 204 in this example, the polishing rate is greater at point 436b than the point 436a on the substrate 115, where the velocity vectors are in opposing directions at point 436a, which is primarily due to the increased velocity difference at point 436b versus point 436a due to the difference in the radii extending from the polishing pad axis 206. This effect is further discussed in FIGS. 4D-4E and 5A.

As illustrated in FIG. 4B, the relative velocity at the first point 440 is the same as the second point 442. Even though the relative velocity varies with angular position, when using constant rotation rates the difference averages out to be the same for a given radius if a complete rotation angle sweep (e.g., >360 degree) is repeated at least once and more typically repeated multiple times. Thus, in this embodiment, all points on a given radius (e.g., the points 436a, 436b, 438a, 438b, 440, and 442) of the substrate 115 will wear at the same rate.

FIG. 4C shows the relative velocities of the points 435a, 435b, 437a, 437b, 439a, and 439b according to their angular position. The angular positions of points 435a, 435b, 437a, 437b, 439a, and 439b are the same as the angular positions of points 436a, 436b, 438a, 438b, 440, and 442 (in FIG. 4B), respectively. For example, the first point 440 and the point 439a are both positioned at 180 degrees from the positional marker 426a (e.g., at 0 degrees).

A curve 429 represents the relative velocity at all points on the substrate 115 at the second radial distance; including the points 435a, 435b, 437a, 437b, 439a, and 439b; as a function of angular position. As shown, the relative velocities of points 435a, 435b, 437a, 437b, 439a, and 439b change with angular position in a manner similar to that described in FIG. 4B. Thus, the relative velocities of the curve 429 increase and decrease with angular position in the same manner as the curve 428 shown in FIG. 4B, but the curve 429 has less of a difference between its maximum and minimum relative velocities (e.g., at the point 435b and the point 435a, respectively) than the curve 428 (e.g., a maximum relative velocity at the point 436b and a minimum relative velocity at the point 436a). The difference is less because the second radial distance is less than the first radial distance. However, the relative velocities of curves 428 and 429 will average out to be the same over the course of one full rotation (e.g., 0 to 360 degrees), as shown by the dashed line in FIGS. 4B and 4C, when constant rotation rates are used for the polishing pad 204 and the carrier head. Thus, the average relative velocity is the same for all points on the substrate 115.

Varying the rotation rates of the polishing pad 204 and/or the carrier head may also change the relative velocity and thus the polishing process material removal rate, also referred to herein as a polishing rate, of the substrate 115. In particular, varying the rotation rates of the carrier head with the angular position of a given point on the substrate 115 may result in different relative velocities (and thus polishing process material removal rates) for different portions or points of the substrate 115. This concept may be used to create an asymmetric removal profile as discussed in FIGS. 5B-5D.

Relative Velocity Analysis

Figure 4D:
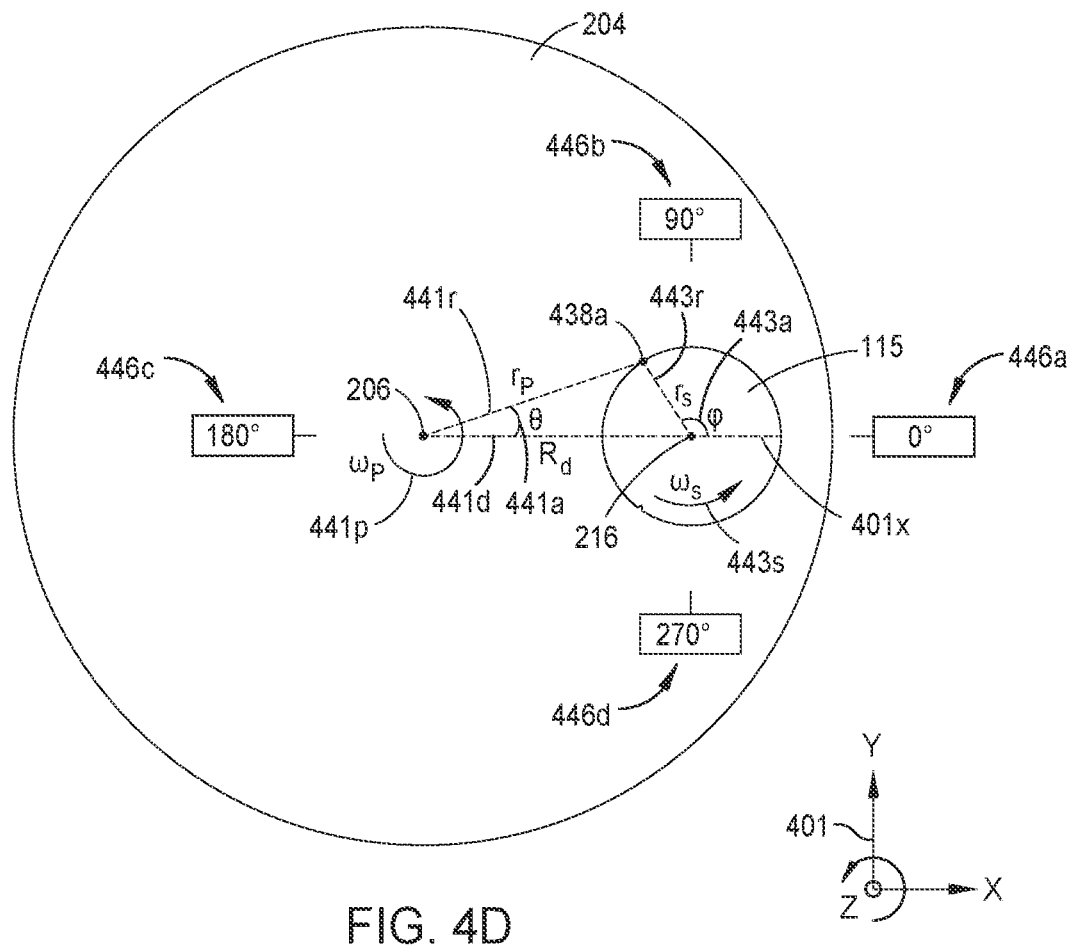
FIGS. 4D-4E depict schematic top views of a polishing pad and substrate that can be used to determine a magnitude of a relative velocity at a point on the substrate from FIG. 4A during portions of a polishing process, according to embodiments described herein.

FIG. 4D is a schematic top view of the polishing pad 204 and the substrate 115 that is used herein to describe a process of determining a magnitude of a relative velocity of a point (e.g., the point 438a) coincident with a point on the substrate 115 during portions of a polishing process, according to embodiments described herein. Although in some embodiments, the carrier head 210 and/or polishing pad 204 typically sweeps during polishing, this movement is ignored in this discussion to simplify the discussion. A coordinate system 401 is similar to the coordinate system 201. In some embodiments, the coordinate system 401 has an origin at the polishing pad axis 206. In other embodiments, the origin is at the carrier head axis 216.

An equation to calculate the magnitude of the relative velocity of the point 438a is derived in several steps. "Analysis of Slurry Flow in Chemical-Mechanical Polishing" by Krzysztof D. Kopanski, (Thesis (SM)—Massachusetts Institute of Technology, Dept. of Mechanical Engineering, 2005), which is incorporated herein by reference in its entirety, describes some methods associated with calculating relative velocity as described herein. Additionally, "Mechanics, Mechanisms, and Modeling of the Chemical Mechanical Polishing Process" by Jiun-Yu Lai (Thesis (Ph.D.)—Massachusetts Institute of Technology, Dept. of Mechanical Engineering, 2001), which is incorporated herein by reference in its entirety, describes additional methods associated with calculating relative velocity as described herein. Using similar notation, as described in these references, a relative velocity vector of a point on substrate 115 is calculated per the following equation, where variables used may differ from the reference:

$$V_{rel} = [-(\omega_p - \omega_s) r_s \sin \varphi] \hat{i} + [(\omega_p - \omega_s) r_s \cos \varphi - \omega_p R_d] \hat{j},$$

where $V_{rel}$ is the relative velocity of a point (e.g., point 438a) on the substrate 115, $\omega_p$ is an angular velocity 441p of the polishing pad 204, $\omega_s$ is an angular velocity 443s of the substrate 115, $r_s$ is a radius 443r between the carrier head axis 216 and the point, $R_d$ is the distance 441d between the polishing pad axis 206 and the carrier head axis 216, and $\varphi$ is an angle 443a between an x-axis 401x of the coordinate system 401, which is colinear with $R_d$, and the radius 443r. As discussed in "Analysis of Slurry Flow in Chemical-Mechanical Polishing", a typical oscillating sweeping movement of the carrier head 210 relative to the polishing pad 204 can be ignored because the movement does not significantly contribute much to the relative velocity.

A magnitude of the relative velocity is calculated per the following equation:

$$|V_{rel}| = \{[-(\omega_p - \omega_s) r_s \sin \varphi]^2 + [(\omega_p - \omega_s) r_s \cos \varphi - \omega_p R_d]^2\}^{(1/2)},$$

where $|V_{rel}|$ is the magnitude of the relative velocity. Thus, a greater difference between the angular velocity 441p of the polishing pad 204 and the angular velocity 443s of the substrate 115 will result in a greater difference between the maximum and minimum relative velocities. Similarly, a point rotated at a larger radius (e.g., a radial distance) between the carrier head axis 216 and the point will result in larger maximum and minimum relative velocities than a point rotated at a smaller radius. However, as discussed in FIGS. 4B and 4C, over the course of one full rotation an average relative velocity for any given radius (e.g., $r_s$) on the substrate 115 will be the same when polishing pad 204 and carrier head 210 rotate at constant angular velocities.

Although not used in the previous relative velocity vector equation, the polishing pad 204 has a radius 441r (e.g., $r_p$) between the polishing pad axis 206 and the point and an angle 441a (e.g., θ) between the x-axis 401x and the radius 441r. Angles 441a and 443a are oriented such as shown by angular positional markers 446 (e.g., an angular positional marker 446a at 0 degrees, an angular positional marker 446b at 90 degree, an angular positional marker 446c at 180 degree, and an angular positional marker 446d at 270 degree angular positions). Notably, the angular positional markers 446 are oriented differently than 426 in FIG. 4A, which is discussed later in FIG. 4D.

Angular velocities 441p and 443p are calculated per the following equation:

$$\omega = RPM/(60 \text{ sec/min}) * 2\pi \text{ rad/rev},$$

where ω is an angular velocity. In one example, the carrier head 210, and thus the substrate 115, rotates at a constant rate of 66 RPM. Thus, the angular velocity 443s of the substrate 115 is 6.91 rad/sec. In one example, the polishing pad 204 rotates at a constant rate of 81 RPM and thus the angular velocity 441p is 8.48 rad/sec.

In one example, the substrate 115 is a 300 mm wafer and so the radius 443r is 0.15 m because the point 438a is at a perimeter or edge of the substrate 115. The point 438a is at an angle 443a of 125 degrees (2.18 rad). The distance 441d between the polishing pad axis 206 and the carrier head axis 216 is 0.19 m. Thus, the magnitude of the relative velocity at the point 438a is 1.49 m/s.

As previously discussed, the angular positional markers 446 are shown in a different orientation than the angular positional markers 426 in FIG. 4A such that they are shifted by 90 degrees when compared to FIG. 4A. For example, the 90 degree angular position marker 426b in FIG. 4A is at the same orientation as the 0 degree angular position marker 446a in FIG. 4D. Thus, when calculating the relative velocities for points at different angular positions, this 90 degree shift should be taken into account. In this example, the radius 443r is oriented such that the radius 443r, and thus point 438b, is at an angular position of 125 degrees. However, as shown in FIGS. 4A and 4B, the point 438b is at an angular position of 215 degrees (90 degrees more than 125 degrees). Thus, when calculating the magnitude of the relative velocity of a point, 90 degrees must be added to the angle to convert to the angular positional markers 426.

In other embodiments, the polishing pad 204 and/or the carrier head 210 may rotate at different constant rates or at a variable rotation rates as discussed in FIGS. 5A-5F. In such embodiments, the equations discussed in this section may be used to calculate the relative velocity for periods when the angular velocities are constant.

Figure 4E:
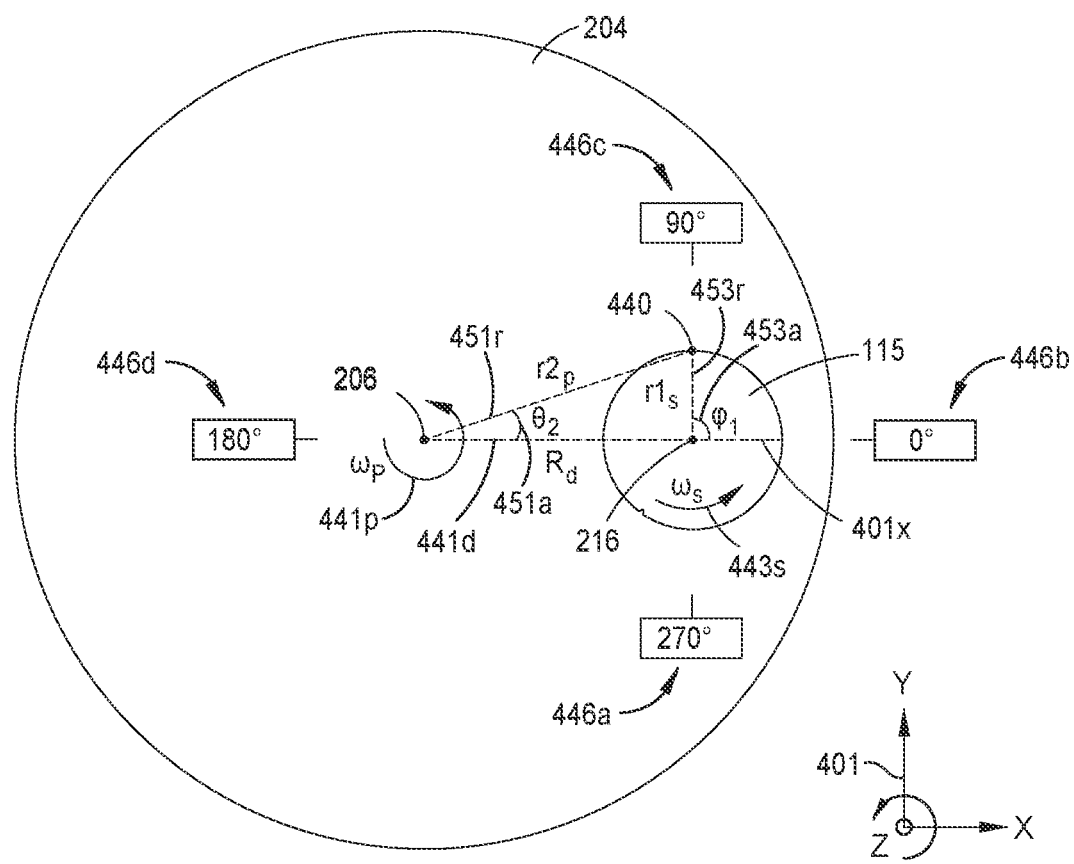

FIG. 4E is a schematic top view of the polishing pad 204 and the substrate 115 that is used herein to describe a process of determining a magnitude of a relative velocity of a different point (e.g., the first point 440) coincident with a point on the substrate 115 during portions of a polishing process, according to embodiments described herein. The magnitude of the relative velocity is calculated in a substantially similar fashion as discussed in FIG. 4D.

In FIG. 4E, a first radius 453r (e.g., $r1_s$) is between the carrier head axis 216 and the first point 440, and a first angle 443a (e.g., $\varphi_1$) is between the x-axis 401x of coordinate system 401 and the first radius 453r. A second radius 451r (e.g., $r2_p$) is between the polishing pad axis 206 and the first point 440 and a second angle 451a (e.g., $\theta_2$) is between the x-axis 401x and the second radius 451r.

In one example, the substrate 115 is a 300 mm wafer and so the first radius 453r is 0.15 m because the point 438a is at a perimeter or edge of the substrate 115. The angular velocity 443s of the substrate 115 is 6.91 rad/sec and the angular velocity 441p of the polishing pad 204 is 8.48 rad/sec. The first point 440 is at a first angle 453a of 90 degrees (1.57 rad). The distance 441d between the polishing pad axis 206 and the carrier head axis 216 is 0.19 m. Thus, the magnitude of the relative velocity at the first point 440 is 1.62 m/s. When accounting for the angular shift discussed in FIG. 4D, the first point 440 is at 180 degrees as shown in FIGS. 4A and 4B.

Asymmetric Removal Process Examples

Figure 5A:
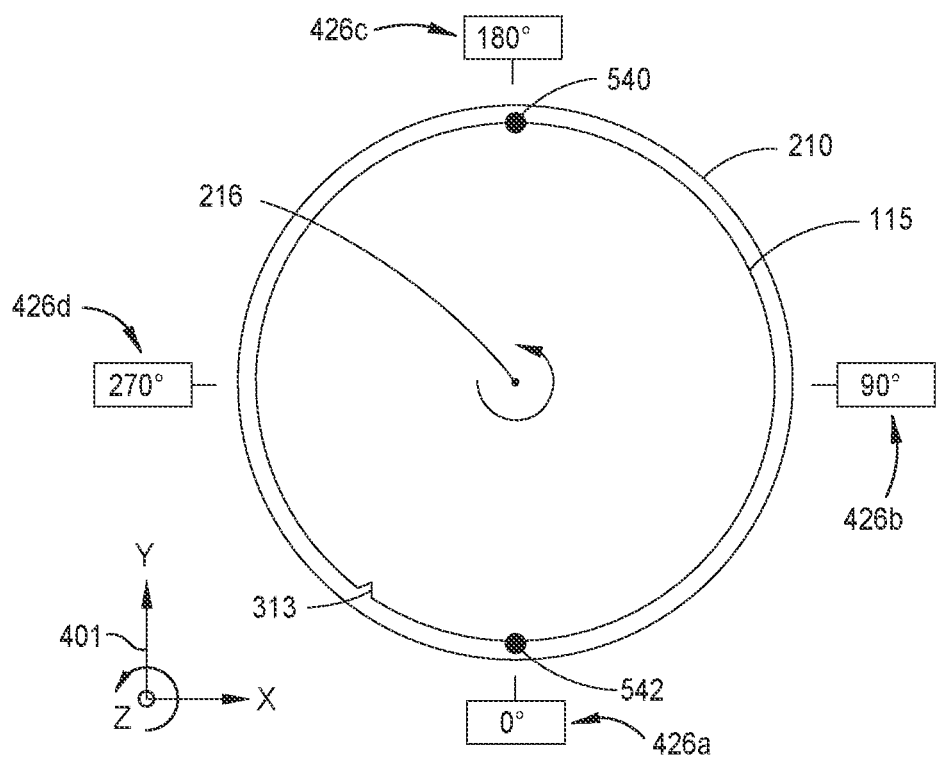
FIGS. 5A-5B depict relative velocities of two different points on the substrate from FIGS. 5A-5D at different rotation rates of the carrier head according to embodiments described herein.
Figure 5B:
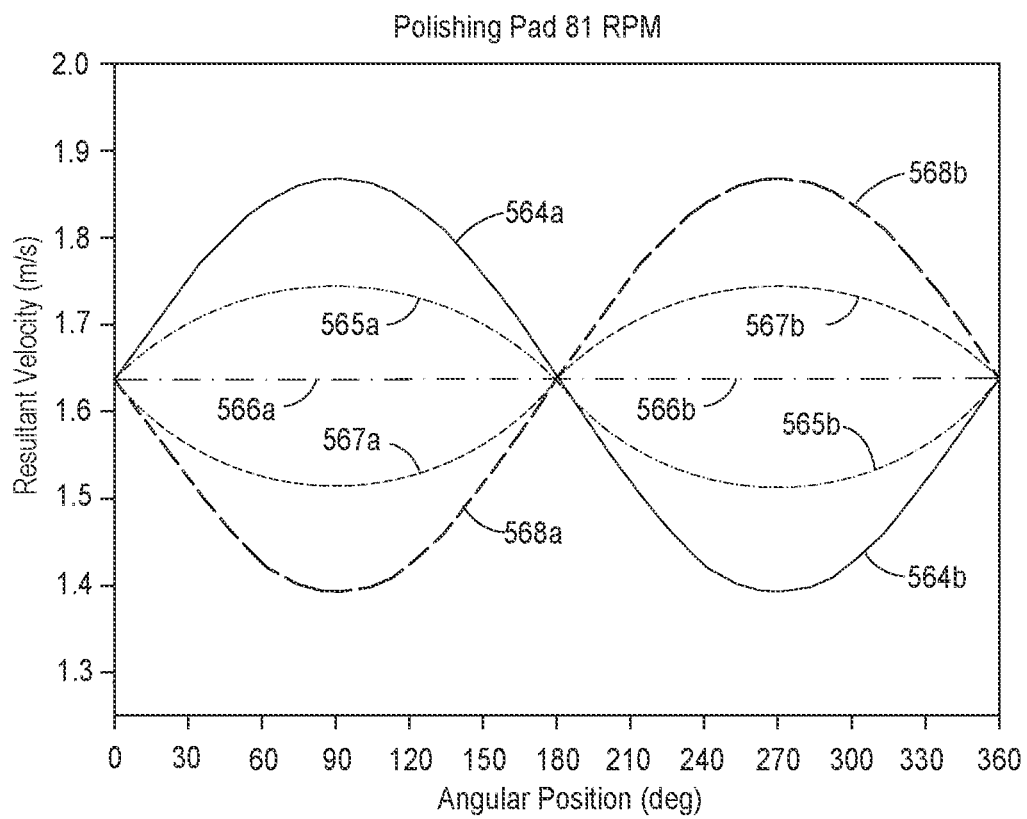

FIGS. 5A and 5B depict relative velocities of a first point 540 and a second point 542 on the substrate 115 at different rotation rates of the carrier head 210 according to embodiments described herein. In particular, the substrate 115 may rotate about the carrier head axis 216 and what was formally known as simply the first point 440 and the second point 442 are now referred to as the first point 540 and the second point 542. For example, the points 540 and 542 rotate with the substrate 115 to a different angular position from their initial starting points that coincided with the points 440 and 442 in FIG. 4A. The relative velocities vary with the angular position of the points 540 and 542, similar to as previously discussed in FIGS. 4A-4E.

FIG. 5A depicts angular positions for the points 540 and 542 on the substrate 115. In particular, FIG. 5A is substantially similar to FIG. 4A and shows a substrate 115 in a carrier head 210 with angular positional markers 426.

FIG. 5B depicts a graph of the relative velocities of the points 540 and 542 at different, constant rotation rates of the carrier head 210 relative to a constant polishing pad (e.g., the polishing pad 204 in FIG. 3A) rotation rate. In particular, FIG. 5B shows the relative velocities of the points 540 and 542 at different angular positions for different rotation rates of the carrier head 210 relative to the constant polishing pad rotation rate.

In this embodiment, both the polishing pad 204 and the carrier head 210 rotate in a counter-clockwise direction. In one polishing process example, the rotation rate of the polishing pad 204 is constant at 81 RPM. Lines 564a and 564b show the relative velocity with a carrier head 210 rotation rate of 66 RPM (e.g., carrier head/substrate rotation rate is ~80% of the polishing pad rotation rate) as a function of the angular position of the points 540 and 542 of the substrate 115 from the zero degrees position. Similarly, lines 565a and 565b show the relative velocity for 73.5 RPM (e.g., carrier head/substrate rotation rate is ~90% of the polishing pad rotation rate). Lines 567a and 567b show the relative velocity for 88.5 RPM (e.g., carrier head/substrate rotation rate is ~110% of the polishing pad rotation rate). Lines 568a and 568b for 96 RPM (e.g., carrier head/substrate rotation rate is ~120% of the polishing pad rotation rate).

In one embodiment of this configuration where the rotation rate of the polishing pad 204 and the carrier head 210 are both 81 RPM, as in lines 566a and 566b, the relative velocities of each of the points 540 and 542 are constant, equal, and do not vary with the position of the carrier head 210. Notably, the relative velocities fluctuate as the carrier head 210 rotates and when the rotation rate of the carrier head 210 differs from that of the polishing pad 204. As shown, the relative velocities converge at 0, 180, and 360 degrees.

While the application refers to 360 degrees and 0 degrees, these terms are not meant to be limiting and may be used interchangeably unless specifically noted. For example, 360 degrees is the same physical angular position as 0 degrees and may be referred to or illustrated in figures as 0 degrees.

The fluctuating maximum and minimum relative velocities can be beneficially used to control the relative velocities for a point, such as the first point 540, which is at the maximum thickness of the substrate 115 to adjust the polishing rate at these points. For example, if the rotational rate of the first point 540 is 66 RPM within the angular region from 0 to 180 degrees, the relative velocities are illustrated as line 564a and there is a maximum relative velocity (i.e., maximum polishing rate) at 90 degrees. If the rotational rate switches to 96 RPM when the first point 540 is within the angular region from 180 degrees to 360 degrees, then the relative velocities follow line 568b and there is a second maximum relative velocity at 270 degrees. The relative velocities of the second point 542, which is at the opposite side edge of the substrate 115, will then follow lines 564b and 568a, which have minimum relative velocities at 90 and 270 degrees. The average relative velocity of lines 564a and 568b is higher than the average relative velocity of lines 564b and 568b, and thus the polishing rate experienced by the first point 540 and second point 542 are different. Thus, varying the rotation rate of the carrier head 210 with the angular position of the first point 540 as discussed ensures the first point 540 will experience a higher average relative velocity than the second point 542 during this portion of the polishing process. This results in a higher polishing rate for the first point 540, which, in this example, coincides with the maximum thickness of the substrate, versus the polishing rate experienced by the second point 542, which coincides with the minimum thickness, during a polishing process, and thus is used to create an asymmetric removal profile.

Figure 5C:
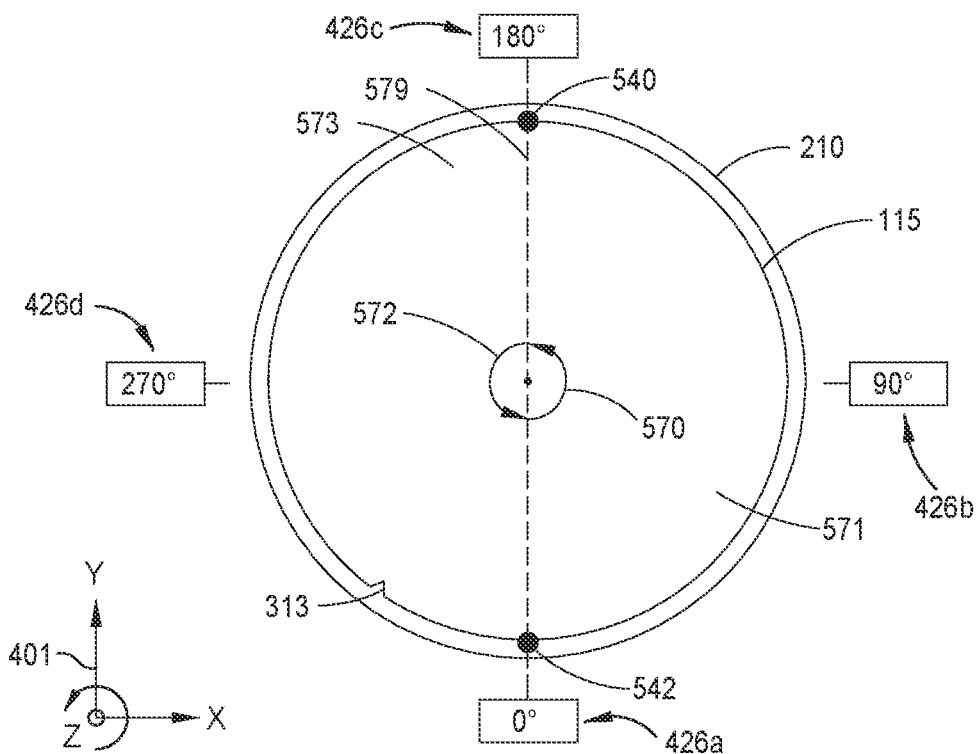
FIGS. 5C-5D depict relative velocities of the points and the substrate from FIGS. 5A-5B when the carrier head rotates at variable rotation rates according to embodiments described herein.
Figure 5D:
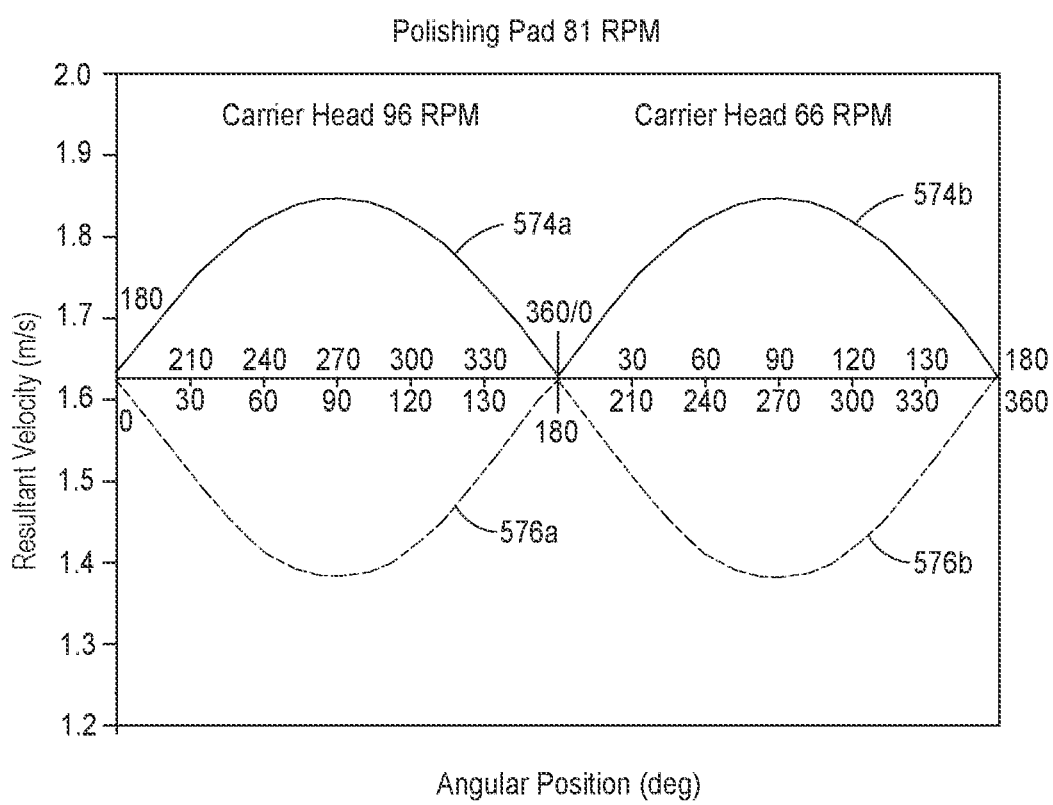

FIGS. 5C and 5D depict relative velocities of the points 540 and 542 when the carrier head 210 rotates at variable rotation rates according to embodiments described herein. In particular, FIGS. 5C and 5D show a first rotation rate 570 and a second rotation rate 572. As discussed in FIG. 5B, the relative velocities vary with the rotation rate and the angular position of the carrier head 210.

FIG. 5C shows a first zone 571 and a second zone 573 separated by a dividing line 579. The dividing line 579 is shown in phantom line for illustrative purposes and is not physically present on the substrate 115. The dividing line connects the 0 degree and 180 degree angular positions, and is fixed in space. The zones 571 and 573 are used to explain how the rotation rate (e.g., the first rotation rate 570 and the second rotation rate 572) of the carrier head 210 changes with the angular position of the first point 540.

While the carrier head 210 rotates, the first point 540 is in one of the zones and the second point 542 is in the other zone, unless both of the points 540 and 542 are between the zones 571 and 573 on the dividing line 579. For example, when the first point 540 is in the second zone 573 the second point 542 is in the first zone 571. As previously discussed in FIG. 5B, the average relative velocities of the points 540 and 542 can be controlled by varying the rotation rate of the carrier head 210 as a function of angular position. As noted above, it is assumed that the platen and polishing pad are rotating a constant rate in this example, and thus the average relative velocities of the points 540 and 542 are directly affected by the adjustment of the rotation rate of the carrier head 210. In one example, while the first point 540 is in the second zone 573 the carrier head 210 rotates at the second rotation rate 572 and while the first point 540 is in the first zone 571 the carrier head 210 rotates at the first rotation rate 570. This ensures the average relative velocity of the first point 540 is higher than the average relative velocity of the second point 542 if appropriate rotation rates 570 and 572 are used. The higher average relative velocity of the first point 540 results in a higher polishing rate for the first point 540, which results in an asymmetric removal profile where more material is removed at the first point 540 than the second point 542. The asymmetric removal profile is beneficial when the first point 540 is at or near the maximum thickness of substrate 115 and the second point 542 is at or near the minimum thickness.

In this way, the asymmetric removal profile can be used to correct layer thickness asymmetry in the substrate 115. As previously discussed in FIG. 1, the measurements and the orientation of the thickness profile formed on the substrate are detected and recorded before polishing. The asymmetrical removal profile can be modeled before polishing using the concepts discussed in the previous figures. For example, a material removal rate can be calculated or correlated using the rotation rates of the polishing pad and the carrier head 210. In this embodiment, the material removal rate varies with zones 571 and 573 because different rotation rates 570 and 572 are used for each of zones 571 and 573. Other factors, such as down-force provided to the substrate 115 during polishing, fluids used for polishing, and flow rates of the fluid, may also be considered in the adjustment of the asymmetrical removal profile model. The model further uses the determined location and orientation of the maximum and minimum thicknesses of the substrate 115 to define the alignment of the asymmetric removal profile with the asymmetric thickness profile of the substrate 115 such that the asymmetry of the substrate is reduced or removed after polishing.

FIG. 5D depicts a plot of the relative velocities of the points 540 and 542 at rotation rates 570 and 572 of the carrier head 210 during polishing. In particular, FIG. 5D shows the effect of varying the rotation rate of the carrier head 210 based on whether the first point 540 is in zone 571 or 573.

In this embodiment, the first rotation rate 570 is 66 RPM and the second rotation rate 572 is 96 RPM. When the first point 540 travels through the second zone 573 the relative velocities of the first point 540 are illustrated by line 574a and the relative velocities of the second point 542 are illustrated by line 576a. When the first point 540 travels through the first zone 571 the relative velocities of the first point 540 are line 574b and the relative velocities of the second point 542 are line 576b.

Varying the rotation rate of the carrier head 210 results in the relative velocities (e.g., lines 574) of the first point 540 being generally higher than the corresponding second relative velocities (e.g., lines 576) of the second point 542. In this example, the first point 540 travels at a maximum relative velocity of about 1.85 m/sec at 90 and 270 degrees, respectively. While the first point is at the maximum relative velocity, the second point 542 is at a minimum relative velocity of about 1.38 m/sec at 270 and 90 degrees. The higher relative velocities (e.g., the lines 574a and 574b) of the first point 540 beneficially creates an asymmetric removal profile as previously discussed in FIGS. 5B and 5C.

As discussed in FIG. 4A-4E, points along a same radius (e.g., the radius 443r in FIG. 4D) will have a maximum and minimum relative velocity at the same angular position (e.g., the points 436b and 435b in FIGS. 4B and 4C, respectively). Thus, if the substrate 115 is oriented such that its maximum thickness coincides with a radius of the first point 440 described in FIGS. 5A-5D, then a point at the maximum thickness will travel at the highest average relative velocity and wear at a faster rate than other angular positions of the substrate 115. This is true even if the maximum thickness is at a shorter radius than a minimum thickness such that the relative velocity of the point at the maximum thickness has a lesser magnitude than the relative velocity of a point at the minimum thickness. Therefore, orienting the substrate 115 such that the point at the maximum thickness drives the rotation rates 570 and 572 as described in FIG. 5D ensures the point at the maximum thickness experiences the highest wear rate. In some embodiments, this means positioning or aligning the point at the maximum thickness (e.g., the first point 540) at angular positional marker 426a (e.g., 0 degrees) at the beginning of the polishing process.

Figure 5E:
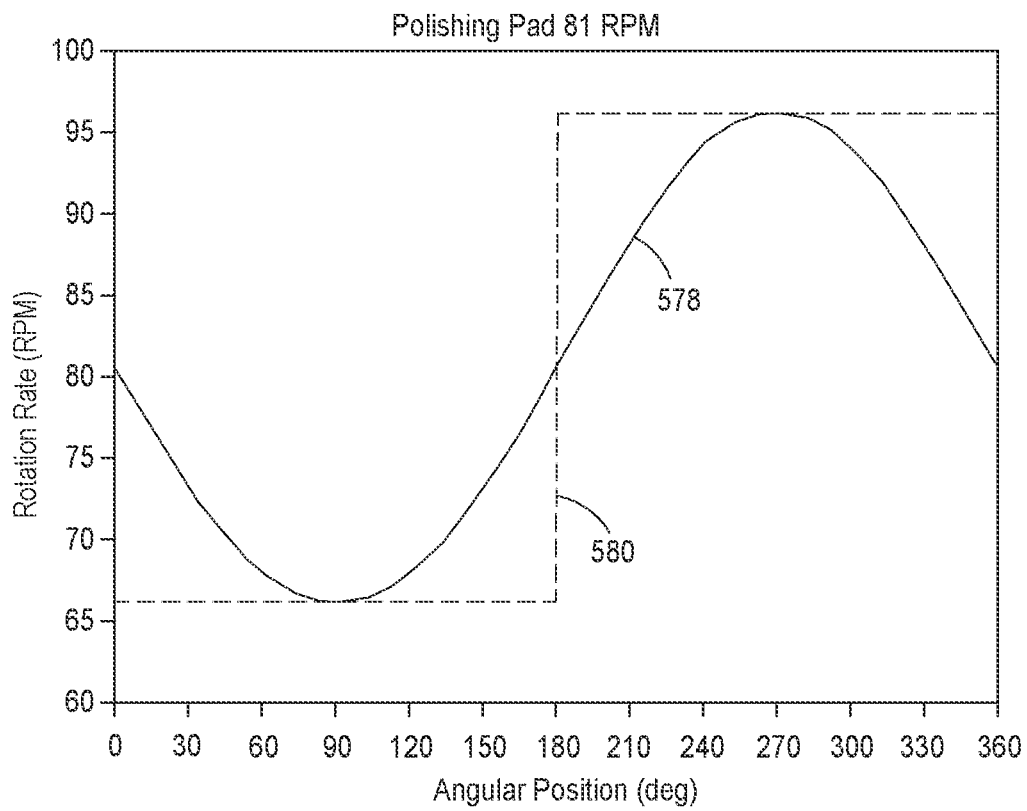
FIGS. 5E-5F depict different rotation rate profiles and relative velocities per different angular positions of the points from FIGS. 5C-5D according to embodiments described herein.

FIG. 5E depicts a chart of two rotation rate functions, such as a square wave 580 and a sinusoidal wave 578, which vary the rotation rates 570 and 572 as a function of angular position of the first point 540 during a complete rotational cycle of the carrier head 210. As shown, the first point 540 starts the cycle at 0 degrees, which is a different starting angular position than FIG. 5D.

In certain embodiments, such as in FIGS. 5B and 5D, the square wave 580 function is used to achieve the rotation rates 570 and 572. In this embodiment, when using the square wave 580 function, the second rotation rate 572 is set at 96 RPM while the first point 540 is in the second zone 573 and the first rotation rate 570 is set at 66 RPM while the first point 540 is in the first zone 571. The first and second rotation rates 570 and 572 are achieved through first and second rotation velocity profiles, respectively, because the carrier head 210 must ramp up and ramp down when transitioning between rotation rates 570 and 572. For example, carrier head 210 cannot instantaneously switch between 96 and 66 RPM. Thus, rotation rates 570 and 572 each include a plurality of rotation rates. Thus, the substrate 115 may be rotated about the carrier head axis 216 for one angle at a first rotation velocity profile and then rotated for another angle at a second rotation velocity profile such that the first rotation velocity profile is different from the second rotation velocity profile. Alternatively, the substrate 115 may be rotated 180 degrees or less within a 360 degree rotation at a first rotation velocity profile, then rotated 180 degrees or less within the 360 degree rotation at a second rotation velocity profile, such that the second rotation velocity profile is different from the first rotation velocity profile. This process may be repeated at least once.

This cycle continues as the carrier head 210 continues to rotate during processing. However, the sudden and repeated change in the rotation rates 570 and 572 may be harsh on a mechanism, motor, or actuator driving the rotation of the carrier head 210 and a smoother transition between zones 571 and 573 may be desired. Thus, in some embodiments, a sinusoidal wave 578 is used to achieve the rotation rates 570 and 572 through the first and second rotation velocity profiles. In one example, when using the sinusoidal wave 578 function, the second rotation velocity profile starts at 81 RPM at 180 degrees, gradually increases to the second rotation rate 572 (e.g., 96 RPM) at 270 degrees, and then gradually decreases back to 81 RPM at 360 degrees while the first point 540 is in the second zone 573. When entering the first zone 571 at 0 degrees, the rotation rate transitions to the first rotation velocity profile at 81 RPM, gradually decreases to the first rotation rate (e.g., 66 RPM) at 90 degrees, and then gradually increases back to 81 RPM at 180 degrees. The cycle is repeated as the first point 540 again enters the second zone 573. The gradual increase and decrease of the sinusoidal wave 578 is gentler on the mechanism, motor, or actuator driving the rotation of the carrier head 210 and provides a smoother transition between the zones 571 and 573 than the square wave 580, and thus improves the life of the mechanical components within the system.

Figure 5F:
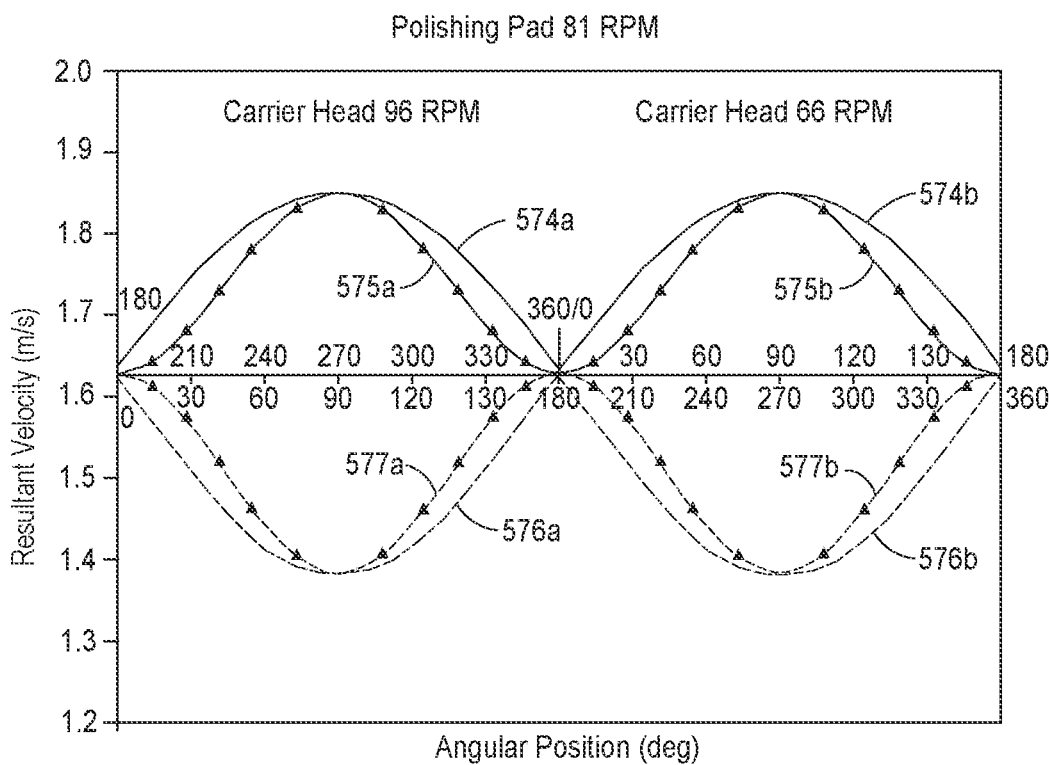

FIG. 5F depicts a chart of the relative velocities of the points 540 and 542 using the rotation rate functions discussed in FIG. 5E according to embodiments described herein. In particular, FIG. 5F shows the effect of using the square wave 580 and the sinusoidal wave 578 to control the rotation rates 570 and 572 of the carrier head 210 based on whether the first point 540 is in zone 571 or 573. In this example, the first rotation rate 570 is 66 RPM and the second rotation rate 572 is 96 RPM. Therefore, when the first point 540 travels through the second zone 573, the relative velocities of the first point 540 are illustrated by line 574a when using the square wave 580 and line 575a when using the sinusoidal wave 578. The corresponding relative velocities for the second point 542 are illustrated by line 576a when using the square wave 580 and line 577a when using the sinusoidal wave 578. Similarly, when the first point 540 travels through the first zone 571, the relative velocities of the first point 540 are illustrated by line 574b when using the square wave 580 and line 575b when using the sinusoidal wave 578. The corresponding relative velocities for the second point 542 are illustrated by line 576b when using the square wave 580 and line 577b when using the sinusoidal wave 578.

As shown, the relative velocities 574 and 576 (e.g., lines 574 and 576) for the square wave 580 have a greater magnitude on average than the relative velocities 575 and 577 (e.g., lines 575 and 577) of the sinusoidal wave 578, respectively. In one example, the averages of the relative velocities 574 and 576 of the square wave 580 are about 20% more than the averages of the relative velocities 575 and 577 of the sinusoidal wave 578. However, as previously discussed, the sinusoidal wave 578 beneficially provides a smoother transition between the rotational rates 570 and 572. Thus, in certain embodiments, the sinusoidal wave 578 is used to avoid excessive wear on the carrier head rotation actuator.

In further embodiments, other rotation rate profiles, or wave patterns, such as a triangle or a sawtooth rotational motion profiles, are used instead of the square wave 580 or the sinusoidal wave 578. While the examples provided herein disclose only a few different rotation rates of the polishing pad 204 and/or the carrier head 210, these examples are not intended to be limiting as to the disclosure described herein since other rotation rates may be used for the polishing pad 204 and/or the carrier head 210. Moreover, the rotating polishing pad configuration described herein is also not intended to be limiting as to the scope of the disclosure provided herein since a configuration that utilizes a linear movement of a polishing pad (e.g., belt style process) may alternately be used to achieve desired relative velocities on a surface of a substrate.

In further embodiments, the zones 571 and 573 may be defined to include other angular positions than 0 and 180 degrees. In further embodiments, the zones may not cover equal angular rotational positions. For example, the substrate rotates for a first angle, other than 180 degrees, at a first rotation rate, and then rotates for a second angle, other than 180 degrees, at a second rotation rate. For example, the first angle may be 30 degrees (such as between the 30 and 60 degree rotational positions) and the second angle may be 300 degrees (such as between the 60, through 360, and 30 degree rotational positions). In further embodiments, more than two zones (e.g., the zones 571 and 573) may be used to vary the rotation rate.

In further embodiments, a rotation rate of the polishing pad 204 is varied and the rotation rate of the carrier head 210 is held at a constant rotation rate. This process can achieve a similar effect as varying the rotation rate of the carrier head 210 and holding the rotation rate of the polishing pad constant. For example, the average relative velocity of the first point 540 can be made higher than the average relative velocity of the second point 542 and beneficially result in an asymmetric removal profile.

In further embodiments using the concepts described herein, the rotational rates of the polishing pad and the carrier head 210 are varied to beneficially result in an asymmetric removal profile. In some embodiments, the rotation rate of the polishing pad 204 and the carrier head 210 are both adjusted to improve the speed at which the asymmetrical removal process is performed and/or to achieve better control the removal rate during different phases of the polishing process. In one example, it may be desirable to include a high removal rate at the start of the polishing process and then progressively slow down the removal rate as the asymmetry is lessened by adjusting relative velocities (e.g., varying both rotation rates) during one or more different phases of the process.

Figure 6:
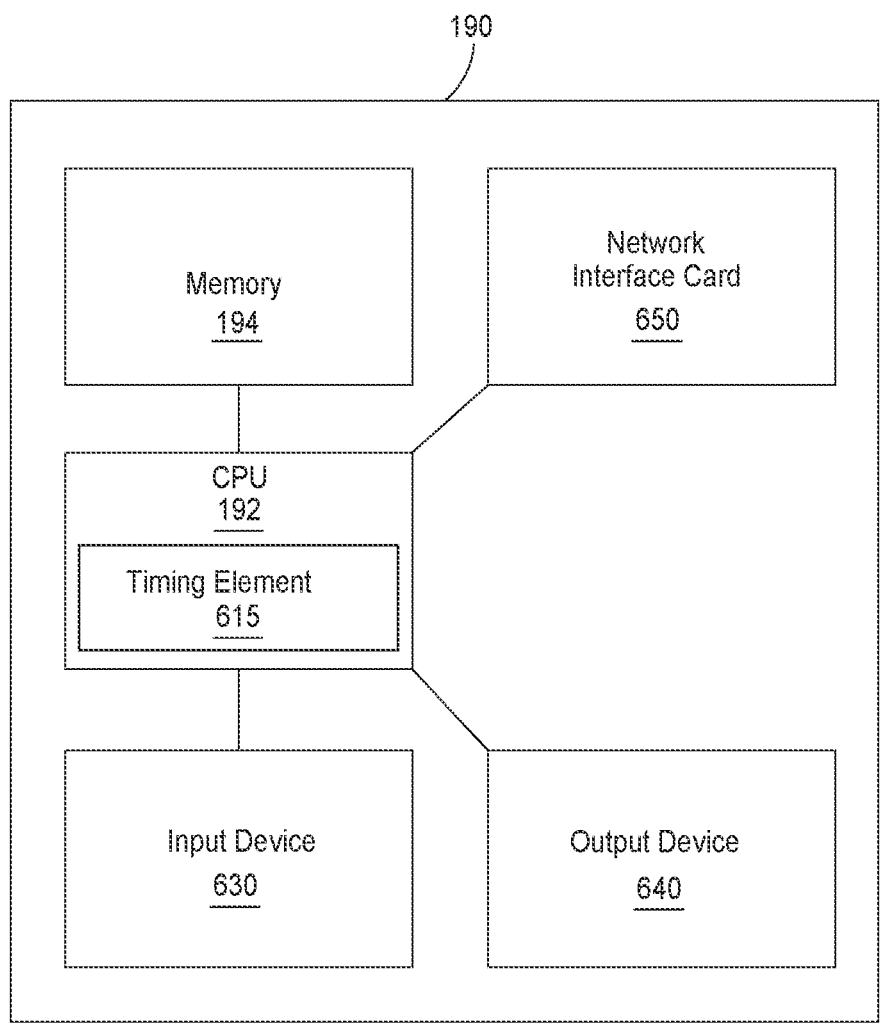
FIG. 6 depicts an example of a functional block diagram of a controller for a carrier head and/or platen or a polishing pad according to embodiments described herein.

FIG. 6 depicts a functional block diagram of one example of a controller 190 for a carrier head (e.g., the carrier head 210 in FIG. 2) and/or a platen or a polishing pad (e.g., the platen 202 or the polishing pad 204 in FIG. 2). The controller 190 includes a processor 192 in data communication with a memory 194, an input device 630, and an output device 640. Though not shown, other embodiments of the controller 190 have similar components as shown for controller 190. In some embodiments, the processor 192 is further in data communication with an optional network interface card 650. Although described separately, it is to be appreciated that functional blocks described with respect to the controller 190 need not be separate structural elements. For example, the processor 192 and memory 620 is embodied in a single chip. The processor 192 can be a general purpose processor, a digital signal processor ("DSP"), an application specific integrated circuit ("ASIC"), a field programmable gate array ("FPGA") or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 192 can be coupled, via one or more buses, to read information from or write information to memory 620. The processor may additionally, or in the alternative, contain memory, such as processor registers. The memory 620 can include processor cache, including a multi-level hierarchical cache in which different levels have different capacities and access speeds. The memory 620 can also include random access memory (RAM), other volatile storage devices, or non-volatile storage devices. The storage can include hard drives, flash memory, etc. In various instances, the memory is referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

The processor 192 also may be coupled to an input device 630 and an output device 640 for, respectively, receiving input from and providing output to a user of the controller 190. Suitable input devices include, but are not limited to, a keyboard, buttons, keys, switches, a pointing device, a mouse, a joystick, a remote control, an infrared detector, a bar code reader, a scanner, a video camera (possibly coupled with video processing software to, e.g., detect hand gestures or facial gestures), a motion detector, or a microphone (possibly coupled to audio processing software to, e.g., detect voice commands). The input device 630 includes an encoder or other sensor to measure the rotation of the carrier head 210 or the platen 202 as discussed in FIG. 2. Suitable output devices include, but are not limited to, visual output devices, including displays and printers, audio output devices, including speakers, headphones, earphones, and alarms, additive manufacturing machines, and haptic output devices. As discussed in FIG. 2, the output device 640 includes various electrical components that are configured to drive and control a mechanism or motor that is used to drive the rotation of the carrier head 210 or the platen 202.

In certain embodiments, the processor 192 includes a timing element 615 such as a crystal or resistor-capacitor combination, and is used as part of an internal oscillator. The timing element may be used by the processor 192 to keep time and, for example, may be used with the encoder to calculate a rotation rate.

In further embodiments, the input device 630, the output device 640, the network interface card 650, and/or other components are considered support circuits (e.g., the support circuits in FIG. 1).

Process Sequence Example

Figure 7:
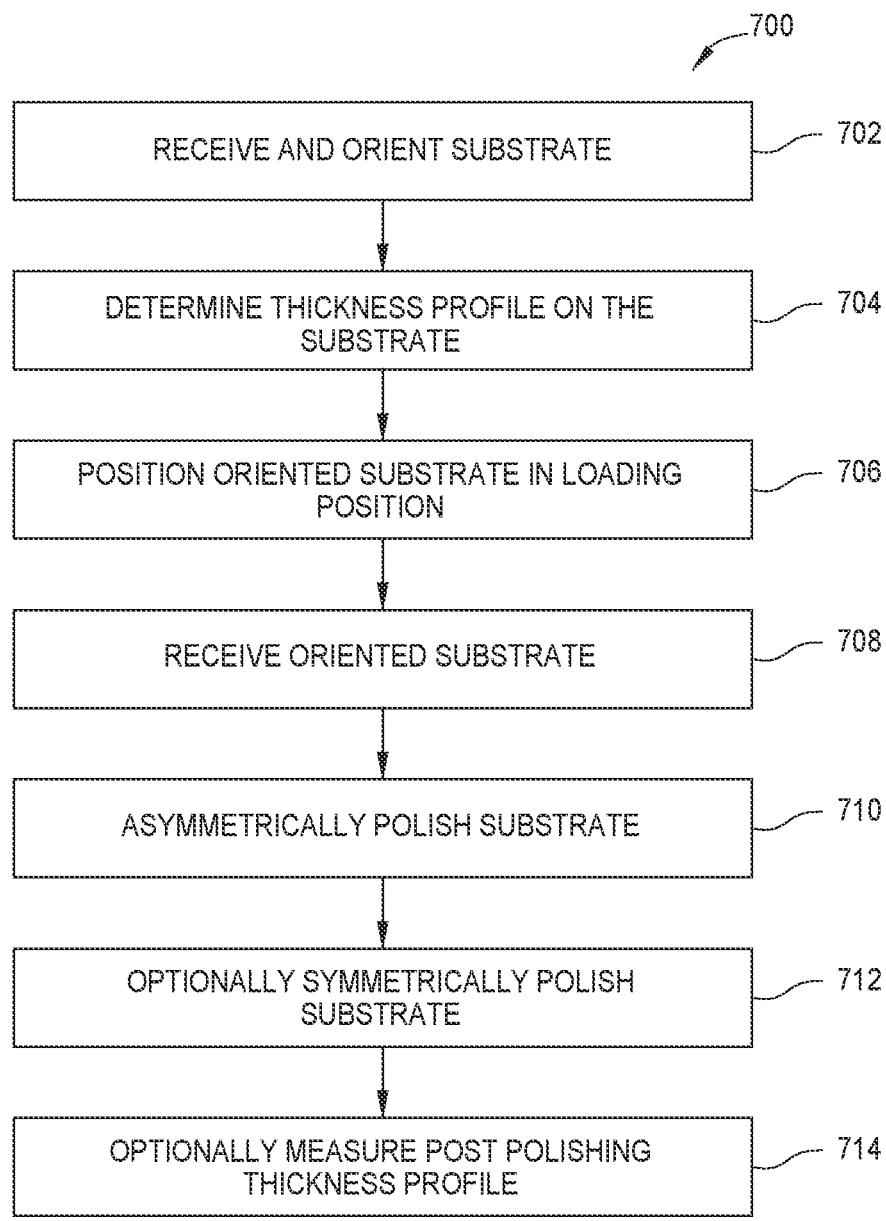
FIG. 7 depicts an example of an asymmetric polishing process sequence that can be performed in a polishing system according to embodiments described herein.

FIG. 7 illustrates an example of an asymmetric polishing process sequence 700 that can be performed in a polishing system, such as the CMP system 100 illustrated in FIG. 1. While the process sequence described in relation to FIG. 7 primarily focuses on the operations used to perform an asymmetric polishing process, this shortened list of operations is not intended to be limiting as to the scope of the disclosure described herein since other polishing process operations may inserted before, during or after the operations discussed in relation to the asymmetric polishing process sequence 700 without deviating from the basic scope of the disclosure provided herein. In one example, as briefly discussed above, one or more cleaning processes may be performed on a substrate in the cleaner 104 within the CMP system 100 after the asymmetric polishing process sequence 700 has been performed on a substrate. In another example, one or more additional polishing processes (i.e., asymmetric polishing process or conventional symmetric polishing processes) may also be performed on a substrate on the same or a different polishing pad 204 within the CMP system 100 using the same carrier head 210 before or after performing the asymmetric polishing process sequence 700.

At operation 702, a substrate 115 is removed from the cassette 114 by the dry robot 110 and positioned in the pre-aligner 118. The pre-aligner 118 is then used to determine the orientation of the substrate 115 by detecting one or more features formed on a surface of the substrate 115, such as the notch 313. The pre-aligner 118 then positions the substrate 115 in a desired angular orientation so that the dry robot 110 can then receive an oriented and pre-aligned substrate 115.

At operation 704, the oriented and pre-aligned substrate 115 is then removed from the pre-aligner 118 by the dry robot 110 and positioned in the metrology station 117. As discussed above, the metrology station 117, is then used to measure a thickness profile of the substrate 115 and determine the orientation of the thickness profile in relation to the one or more features formed on a surface of the substrate 115, such as the notch 313. During operation 704, the controller 190 receives the measurements and the orientation of the thickness profile from the metrology station 117. The controller 190 can then use the measurement and substrate orientation information to coordinate the asymmetric polishing process(es) performed in subsequent operations, for example, as described in FIG. 5D.

In some embodiments, operations 702 and 704 are performed in the same chamber, and thus a separate pre-aligner 118 may not be necessary since the metrology station 117 includes one or more substrate orientation detection elements.

At operation 706, the oriented, pre-aligned and thickness profile measured substrate 115 is then transferred by the dry robot 110 to a transfer platform 116, and the wet robot 108 then transfers the substrate 115 to a load cup 122. Based on the known orientation, alignment and thickness profile of the substrate 115, the substrate 115 is then positioned in a desired position and orientation in the load cup 122 so that a carrier head 210 can pick-up the substrate 115 in a known angular orientation. In some embodiments, the pre-alignment step(s) performed during operation 702 are configured to align and position the substrate 115 such that the subsequent transferring steps performed by the dry robot 110 and wet robot 108 will cause the angular alignment of the substrate 115 to end up in a desired orientation in the load cup 122. The ability of the carrier head 210 to receive the substrate 115, having a known thickness profile, in a known and desirable orientation enables the subsequent asymmetric polishing process at operation 710 to be performed on the desired regions of the substrate 115 in one or more of the polishing stations 124.

At operation 708, the carrier head 210 then picks-up the oriented and aligned substrate 115 from its known position within the load cup 122 and transfers the substrate 115 to a surface 204A of a polishing pad 204 in a polishing station 124 so that the subsequent asymmetric polishing process at operation 710 can be performed. Prior to or during operation 708, one or more carrier head 210 orientation detecting elements are used to assure that the angular orientation of the carrier head 210 relative to the load cup 122 and position of the one or more features formed on a surface of the substrate 115, such as the notch 313, are known and oriented correctly. In some embodiments, the carrier head 210 includes an encoder, position flag or other orientation detecting element(s) that are coupled to an actuator (not shown), which when working together allows the carrier head 210 to be oriented in a known and desired angular orientation when it picks-up the aligned and oriented substrate 115 from the load cup 122.

At operation 710, the controller 190 then coordinates the relative motion of the carrier head 210 and the polishing pad 204 and/or the platen 202 to perform the processing steps used to perform an asymmetric polishing process, as discussed in relation to one or more of the asymmetric removal processes described above. In one example, as discussed in in relation to FIG. 5D, the polishing pad 204 may rotate at a constant rotation rate while the rotation rate of the carrier head 210 is varied with the angular position of the carrier head 210. The controller 190 coordinates the rotation rates with the thickness profile of the oriented and aligned substrate 115 such that the orientation of the thickness profile is known in relation to the angular position of the carrier head 210. The coordination of the rotation rates as function of angle of the carrier head 210 results in a portion of the substrate 115, such as the thicker portion 330, being polished at a different polishing rate than a thinner portion 332. As discussed above, by providing a higher relative velocity to the thicker portion 330 versus the thinner portion 332 creates an asymmetric removal profile that beneficially removes more material from the thicker portion 330 than the thinner portion 332 during polishing. As previously discussed, the carrier head 210 and the polishing pad 204 or the platen 202 may each rotate at different constant and/or varying rotation rates to achieve a desired asymmetric polishing profile. In some embodiments, the controller 190 uses the orientation detecting element(s) to determine the angular position of the carrier head 210 and the polishing pad 204 or the platen 202 and their respective actuators to adjust the rotation rates to create the asymmetric removal of material from the substrate.

At operation 712, after performing operation 710, it may be desirable to perform a symmetric polishing process as described in FIGS. 4A-4E. The symmetric polishing process may begin when the difference between a high and a low point (e.g., 440 and 442, respectively, in FIG. 4A) of the substrate 115 reaches a minimum value, which may be predetermined, for example, as a set value or as a percentage of the thickness. At the minimum value, the substrate is considered to have a uniform thickness profile. During operation 712, the controller 190 rotates the carrier head 210 and the polishing pad 204 and/or the platen 202 at constant rotation rates to create a symmetric material removal profile. In other embodiments, operation 712 is performed before operation 710.

At operation 714, after performing operation 710 and/or 712, it may be desirable to measure the post asymmetric polishing process thickness profile on the substrate 115 to determine if an alternate asymmetric polishing process needs to then be performed on the substrate. During operation 714 a plurality of interim processes may be performed, such as the carrier head deposits the polished substrate 115 in the load cup 122, the wet robot 108 transfers the substrate 115 to the cleaner 104, the substrate 115 is cleaned in the cleaner 104, and the dry robot 110 then receives the cleaned substrate 115 from the cleaner 104 and transfers the substrate 115 to the metrology station 117 so that the current thickness profile can be measured. Then, if desired, operations 706-714 can be completed at least one additional time by use of commands from the controller 190. In other embodiments, operation 714 is performed between operations 710 and 712 to check or verify if the difference between the high and low points is at or under the minimum value. Operations 710 and 714 may be repeated at least one time until the minimum value is achieved. Operation 714 may then be performed again after operation 712 is complete to verify the results of operation 712 are satisfactory.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes are made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method of removing material on a substrate, comprising:
    rotating a carrier head in contact with a substrate about a carrier head axis in a first direction at a variable rotation rate that varies as a function of an angular position of a reference point on the carrier head during each complete rotational cycle of the carrier head; and
    urging a surface of the substrate against a polishing surface of a polishing pad supported on a platen while rotating the carrier head.

2. The method of claim 1, further comprising rotating the platen about a platen axis in a second direction.

3. The method of claim 2, wherein the carrier head axis and the platen axis are substantially parallel and non-collinear.

4. The method of claim 1, wherein the variable rotation rate comprises a plurality of first rotation rates for the angular position of between a first angular position and a second angular position and a plurality of second rotation rates for the angular position of between the second angular position and a third angular position.

5. The method of claim 4, wherein the variable rotation rate comprises at least a portion of a step function or a sinusoidal function.

6. The method of claim 5, wherein an average rotation rate of the first rotation rates is greater than an average rotation rate of the second rotation rates.

7. The method of claim 2, wherein the first direction and the second direction are both rotated in a clock-wise direction or both rotated in a counter clock-wise direction.

8. The method of claim 2, wherein rotating the platen about the platen axis comprises rotating the platen at a constant rotation rate.

9. The method of claim 2, wherein rotating the platen about the platen axis comprises rotating the platen at a variable rotation rate.

10. The method of claim 4, wherein a difference between the third angular position and the first angular position is less than or equal to about 360 degrees.

11. The method of claim 1, further comprising measuring a thickness profile of the substrate prior to rotating the carrier head about the carrier head axis in the first direction.

12. The method of claim 11, further comprising:
    orienting and aligning the substrate according to the thickness profile prior to rotating the carrier head about the carrier head axis in the first direction; and
    receiving, by the carrier head, the oriented and aligned substrate,
    wherein the carrier head is configured to urge the surface of the substrate against the polishing surface of the polishing pad while rotating the carrier head.

13. The method of claim 1, wherein the variable rotation rate is such that the material is removed asymmetrically from the surface of the substrate.

14. The method of claim 4, wherein rotating the carrier head about the carrier head axis further comprises rotating the carrier head for the angular position of between the third angular position and a fourth angular position at a constant rotational velocity, wherein the fourth angular position is greater than 360 degrees.

15. A method of removing material on a substrate, comprising:
    rotating a carrier head in contact with a substrate about a carrier head axis in a first direction; and
    urging a surface of the substrate against a polishing surface of a polishing pad supported on a platen while rotating the carrier head about the carrier head axis, wherein
    rotating the carrier head about the carrier head axis comprises:
    (a) rotating the carrier head a 180 degrees or less within a 360 degree rotation at a plurality of first rotation rates,
    (b) then rotating the carrier head a 180 degrees or less within the 360 degree rotation at a plurality of second rotation rates, wherein the plurality of second rotation rates is different from the plurality of first rotation rates, and
    (c) repeating (a) and (b) at least one more time.

16. The method of claim 15, further comprising rotating the platen about a platen axis in a second direction.

17. The method of claim 16, wherein the first direction and the second direction are both in a clock-wise direction or both in a counter clock-wise direction.

18. The method of claim 15, further comprising varying the plurality of first rotation rates and the plurality of second rotation rates according to a step function or a sinusoidal function.

* * * * *